(12) United States Patent
Britt et al.

(10) Patent No.: US 10,256,385 B2
(45) Date of Patent: Apr. 9, 2019

(54) LIGHT EMITTING DIE (LED) PACKAGES AND RELATED METHODS

(75) Inventors: Jeffrey Carl Britt, Cary, NC (US); Brandon Stanton, Raleigh, NC (US); Yankun Fu, Raleigh, NC (US)

(73) Assignee: Cree, Inc., Durham, NC (US)

( * ) Notice: Subject to any disclaimer, the term of this patent is extended or adjusted under 35 U.S.C. 154(b) by 466 days.

(21) Appl. No.: 13/187,232

(22) Filed: Jul. 20, 2011
(Under 37 CFR 1.47)

(65) Prior Publication Data
US 2012/0187862 A1    Jul. 26, 2012

Related U.S. Application Data

(63) Continuation-in-part of application No. 11/982,275, filed on Oct. 31, 2007, now Pat. No. 9,070,850, and
(Continued)

(51) Int. Cl.
*H01L 27/15* (2006.01)
*H01L 29/26* (2006.01)
(Continued)

(52) U.S. Cl.
CPC ............ *H01L 33/62* (2013.01); *H01L 33/642* (2013.01); *H01L 24/29* (2013.01); *H01L 24/32* (2013.01);
(Continued)

(58) Field of Classification Search
CPC ..... H01L 33/58; H01L 33/54; H01L 33/0004; H01L 33/02
(Continued)

(56) References Cited

U.S. PATENT DOCUMENTS 1,880,399 A    10/1932   Benjamin
3,760,237 A     9/1973   Jaffe
(Continued)

FOREIGN PATENT DOCUMENTS

CN    1 274 906 A   11/2000
CN    1274906      11/2000
(Continued)

OTHER PUBLICATIONS

Advisory Action for U.S. Appl. No. 11/149,998 dated Jul. 15, 2010.
(Continued)

*Primary Examiner* — Lex Malsawma
*Assistant Examiner* — Eric W Jones
(74) *Attorney, Agent, or Firm* — Jenkins, Wilson, Taylor & Hunt, P.A.

(57) ABSTRACT

LED packages and related methods are provided. The LED packages can include a submount having a top and bottom surface and a plurality of top electrically conductive elements on the top surface of the submount. An LED can be disposed on one of the top electrically conductive elements. The LED can emit a dominant wavelength generally between approximately 600 nm and approximately 650 nm, and more particularly between approximately 610 nm and approximately 630 nm when an electrical signal is applied to the top electrically conductive elements. A bottom thermally conductive element can be provided on the bottom surface and is not in electrical contact with the top electrically conductive elements. A lens can be disposed over the LED. The LED packages can have improved lumen performances, lower thermal resistances, improved efficiencies, and longer operational lifetimes.

19 Claims, 6 Drawing Sheets

Related U.S. Application Data a continuation-in-part of application No. 12/757,891, filed on Apr. 9, 2010, now Pat. No. 8,866,169.

(51) Int. Cl.

| | |
|---|---|
| *H01L 31/12* | (2006.01) |
| *H01L 33/00* | (2010.01) |
| *H01L 33/62* | (2010.01) |
| *H01L 33/64* | (2010.01) |
| H01L 33/54 | (2010.01) |
| H01L 23/00 | (2006.01) |

(52) U.S. Cl.
CPC .............. *H01L 24/45* (2013.01); *H01L 24/48* (2013.01); *H01L 24/73* (2013.01); *H01L 24/83* (2013.01); *H01L 24/85* (2013.01); *H01L 24/92* (2013.01); *H01L 33/54* (2013.01); *H01L 33/647* (2013.01); *H01L 2224/29144* (2013.01); *H01L 2224/32225* (2013.01); *H01L 2224/45144* (2013.01); *H01L 2224/48091* (2013.01); *H01L 2224/48227* (2013.01); *H01L 2224/48647* (2013.01); *H01L 2224/73265* (2013.01); *H01L 2224/83024* (2013.01); *H01L 2224/8349* (2013.01); *H01L 2224/83097* (2013.01); *H01L 2224/83191* (2013.01); *H01L 2224/83447* (2013.01); *H01L 2224/83805* (2013.01); *H01L 2224/83815* (2013.01); *H01L 2224/83912* (2013.01); *H01L 2224/85447* (2013.01); *H01L 2224/92247* (2013.01); *H01L 2924/00011* (2013.01); *H01L 2924/01013* (2013.01); *H01L 2924/01014* (2013.01); *H01L 2924/01028* (2013.01); *H01L 2924/01087* (2013.01); *H01L 2924/01322* (2013.01); *H01L 2924/12032* (2013.01); *H01L 2924/12041* (2013.01)

(58) Field of Classification Search
USPC ............................ 257/98, 79; 438/22, 25, 46
See application file for complete search history.

(56) References Cited

U.S. PATENT DOCUMENTS

| | | |
|---|---|---|
| 4,152,044 A | 5/1979 | Liu |
| D259,782 S | 7/1981 | Mochizuki et al. |
| 4,307,297 A | 12/1981 | Groff |
| 4,322,725 A | 3/1982 | Tetsuo et al. |
| 4,322,735 A | 3/1982 | Shibawra et al. |
| 4,511,425 A | 4/1985 | Boyd |
| 4,675,575 A | 6/1987 | Smith |
| 4,946,547 A | 8/1990 | Palmour et al. |
| 5,008,718 A * | 4/1991 | Fletcher .............. H01L 33/0062 257/96 |
| 5,040,868 A | 8/1991 | Waitl |
| 5,042,048 A | 8/1991 | Meyer |
| 5,122,943 A | 6/1992 | Pugh |
| 5,130,761 A | 7/1992 | Toshiaki |
| 5,167,556 A | 12/1992 | Stein |
| 5,200,022 A | 4/1993 | Kong et al. |
| 5,210,051 A | 5/1993 | Carter |
| D345,731 S | 4/1994 | Owens et al. |
| 5,351,106 A | 9/1994 | Lesko |
| RE34,861 E | 2/1995 | Davis et al. |
| 5,393,993 A | 2/1995 | Edmond et al. |
| D358,806 S | 5/1995 | Siegel et al. |
| D359,028 S | 6/1995 | Siegel et al. |
| 5,477,436 A | 12/1995 | Bertling et al. |
| 5,523,589 A | 6/1996 | Edmond et al. |
| 5,703,401 A | 12/1997 | Van de Water |
| 5,706,177 A | 1/1998 | Nather |
| 5,731,547 A | 3/1998 | Derwin et al. |
| D396,847 S | 8/1998 | Nakayama et al. |
| D397,092 S | 8/1998 | Sano et al. |
| 5,790,298 A | 8/1998 | Tonar |
| 5,813,753 A | 9/1998 | Vriens et al. |
| 5,907,151 A | 5/1999 | Gramann |
| 5,942,770 A | 8/1999 | Ishinaga et al. |
| 5,959,316 A | 9/1999 | Lowery |
| 6,040,626 A | 3/2000 | Cheah et al. |
| 6,045,240 A | 4/2000 | Hochstein |
| D424,725 S | 5/2000 | Cousins |
| 6,061,160 A | 5/2000 | Maruyama |
| 6,066,861 A | 5/2000 | Hohn et al. |
| D427,977 S | 7/2000 | Takizawa et al. |
| 6,183,100 B1 | 2/2001 | Suckow et al. |
| D439,351 S | 3/2001 | Kiba et al. |
| 6,224,216 B1 | 5/2001 | Parker et al. |
| 6,242,800 B1 | 6/2001 | Munos et al. |
| 6,259,608 B1 | 7/2001 | Berardinelli et al. |
| 6,265,761 B1 | 7/2001 | Ghai |
| 6,274,924 B1 | 8/2001 | Carey et al. |
| 6,296,367 B1 | 10/2001 | Parsons et al. |
| 6,330,111 B1 | 12/2001 | Myers |
| 6,331,915 B1 | 12/2001 | Myers |
| 6,335,548 B1 | 1/2002 | Roberts et al. |
| 6,359,236 B1 | 3/2002 | Distefano et al. |
| 6,376,902 B1 | 4/2002 | Arndt |
| 6,376,915 B1 | 4/2002 | Hikita et al. |
| 6,392,294 B1 | 5/2002 | Yamaguchi |
| 6,447,124 B1 | 9/2002 | Fletcher et al. |
| 6,454,437 B1 | 9/2002 | Kelly |
| 6,469,321 B2 | 10/2002 | Arndt |
| 6,480,389 B1 | 11/2002 | Shie et al. |
| D466,485 S | 12/2002 | Maehara et al. |
| 6,517,218 B2 | 2/2003 | Hochstein |
| D471,165 S | 3/2003 | Williams et al. |
| 6,536,913 B1 | 3/2003 | Yajima et al. |
| D472,528 S | 4/2003 | Kasem et al. |
| 6,573,580 B2 | 6/2003 | Arndt |
| D476,962 S | 7/2003 | Yoshihira et al. |
| D477,580 S | 7/2003 | Kamada |
| 6,608,334 B1 | 8/2003 | Ishinaga |
| 6,610,563 B1 | 8/2003 | Waitl |
| 6,614,058 B2 | 9/2003 | Lin et al. |
| 6,621,210 B2 | 9/2003 | Kato et al. |
| 6,624,491 B2 | 9/2003 | Waitl et al. |
| 6,657,393 B2 | 12/2003 | Natsume |
| 6,680,490 B2 | 1/2004 | Yasukawa et al. |
| 6,686,580 B1 | 2/2004 | Glenn et al. |
| 6,686,609 B1 | 2/2004 | Sung |
| 6,700,136 B2 | 3/2004 | Guida |
| 6,707,069 B2 | 3/2004 | Song et al. |
| 6,710,373 B2 | 3/2004 | Wang |
| 6,717,353 B1 | 4/2004 | Mueller et al. |
| 6,734,467 B2 | 5/2004 | Schlereth et al. |
| 6,746,889 B1 | 6/2004 | Eliashevich et al. |
| 6,759,733 B2 | 7/2004 | Arndt |
| 6,765,235 B2 | 7/2004 | Tankinaka et al. |
| 6,770,498 B2 | 8/2004 | Hsu |
| 6,774,401 B2 | 8/2004 | Nakada et al. |
| 6,784,463 B2 | 8/2004 | Camras et al. |
| 6,791,259 B1 | 9/2004 | Stokes |
| 6,809,342 B2 | 10/2004 | Harada |
| 6,858,879 B2 | 2/2005 | Waitl |
| 6,872,585 B2 | 3/2005 | Matsumura et al. |
| 6,876,149 B2 | 4/2005 | Miyashita |
| 6,900,511 B2 | 5/2005 | Ruhnau et al. |
| 6,911,678 B2 | 6/2005 | Fujisawa et al. |
| 6,914,268 B2 | 7/2005 | Shei |
| 6,919,586 B2 | 7/2005 | Fujii |
| 6,932,497 B1 | 8/2005 | Huang |
| 6,940,704 B2 | 9/2005 | Stalions |
| 6,946,714 B2 | 9/2005 | Waitl |
| 6,964,877 B2 | 11/2005 | Chen et al. |
| 6,975,011 B2 | 12/2005 | Arndt |
| D515,045 S | 2/2006 | Suenaga |
| 6,995,405 B2 | 2/2006 | Braddell |
| 6,995,510 B2 | 2/2006 | Murakami et al. |
| 7,005,679 B2 | 2/2006 | Tarsa et al. |
| D516,528 S | 3/2006 | Nakamura et al. |

(56) References Cited

U.S. PATENT DOCUMENTS

| | | | |
|---|---|---|---|
| D517,025 S | 3/2006 | Asakawa |
| 7,009,285 B2 | 3/2006 | Su et al. |
| 7,009,627 B2 | 3/2006 | Abe et al. |
| 7,015,514 B2 | 3/2006 | Baur et al. |
| 7,021,797 B2 | 4/2006 | Minano et al. |
| 7,049,159 B2 | 5/2006 | Lowery |
| 7,057,273 B2 | 6/2006 | Hamden et al. |
| 7,064,907 B2 | 6/2006 | Kaneko |
| 7,066,626 B2 | 6/2006 | Omata |
| 7,078,728 B2 | 7/2006 | Ishii et al. |
| 7,087,936 B2 | 8/2006 | Negley |
| 7,091,653 B2 | 8/2006 | Ouderkirk et al. |
| D528,672 S | 9/2006 | Nagai et al. |
| 7,102,213 B2 | 9/2006 | Sorg |
| 7,102,215 B2 | 9/2006 | Arndt |
| 7,119,422 B2 | 10/2006 | Chin |
| 7,126,274 B2 | 10/2006 | Shimizu et al. |
| 7,161,189 B2 | 1/2007 | Wu |
| 7,183,632 B2 | 2/2007 | Arndt |
| 7,187,009 B2 | 3/2007 | Fukasawa |
| D542,743 S | 5/2007 | Jung et al. |
| 7,210,807 B2 | 5/2007 | Sakamoto et al. |
| 7,213,940 B1 | 5/2007 | Van De Ven et al. |
| 7,224,000 B2 | 5/2007 | Aanegola et al. |
| 7,244,965 B2 | 7/2007 | Andrews et al. |
| 7,262,053 B2 | 8/2007 | Hanson et al. |
| 7,264,378 B2 | 9/2007 | Loh |
| 7,271,425 B2 | 9/2007 | Arndt et al. |
| 7,280,288 B2 | 10/2007 | Loh et al. |
| 7,282,740 B2 | 10/2007 | Chikugawa et al. |
| 7,282,785 B2 | 10/2007 | Yoshida |
| 7,285,802 B2 | 10/2007 | Ouderkirk et al. |
| 7,286,926 B2 | 10/2007 | Gotoh et al. |
| 7,293,889 B2 | 11/2007 | Kamiya |
| 7,303,315 B2 | 12/2007 | Ouderkirk et al. |
| 7,317,181 B2 | 1/2008 | Murakami et al. |
| 7,321,161 B2 | 1/2008 | Teixeira et al. |
| 7,364,950 B2 | 4/2008 | Funato et al. |
| D572,210 S | 7/2008 | Lee |
| D572,670 S | 7/2008 | Ono et al. |
| D576,574 S | 9/2008 | Kobayakawa |
| 7,429,757 B2 | 9/2008 | Oyama et al. |
| 7,436,002 B2 | 10/2008 | Brunner et al. |
| 7,439,667 B2 | 10/2008 | Ohtani |
| 7,495,322 B2 * | 2/2009 | Hashimoto | H01L 33/642 |
| | | | 257/676 |
| 7,514,867 B2 | 4/2009 | Yano |
| D591,697 S | 5/2009 | Andrews et al. |
| D593,224 S | 5/2009 | Hanley |
| D594,827 S | 6/2009 | Loh et al. |
| D598,579 S | 8/2009 | Hanley |
| 7,579,628 B2 | 8/2009 | Inoguchi |
| 7,614,759 B2 | 11/2009 | Negley |
| 7,622,795 B2 | 11/2009 | Chiang |
| 7,635,915 B2 | 12/2009 | Xie et al. |
| 7,649,209 B2 | 1/2010 | Hussell et al. |
| 7,675,145 B2 | 3/2010 | Wong et al. |
| 7,692,206 B2 | 4/2010 | Loh |
| 7,705,826 B2 | 4/2010 | Kalt et al. |
| 7,718,991 B2 | 5/2010 | Negley |
| 7,722,220 B2 | 5/2010 | Van de Ven |
| 7,777,412 B2 | 8/2010 | Pang |
| 7,800,124 B2 | 9/2010 | Urano et al. |
| 7,813,400 B2 | 10/2010 | Denbaars et al. |
| 7,821,023 B2 | 10/2010 | Yuan et al. |
| 7,828,460 B2 | 11/2010 | Van de Ven |
| 7,841,747 B2 | 11/2010 | Oon et al. |
| 7,847,302 B2 | 12/2010 | Basin et al. |
| 7,862,214 B2 | 1/2011 | Trott |
| 7,875,899 B2 | 1/2011 | Yasuda |
| 7,919,339 B2 | 4/2011 | Hsu |
| 7,923,831 B2 | 4/2011 | Ng |
| 7,959,329 B2 | 6/2011 | Van de Ven |
| 7,999,283 B2 | 8/2011 | Chakraborty |
| 8,008,676 B2 | 8/2011 | Negley |
| 8,011,818 B2 | 9/2011 | Negley |
| 8,029,155 B2 | 10/2011 | Van de Ven |
| 8,033,692 B2 | 10/2011 | Negley |
| 8,049,230 B2 | 11/2011 | Chan et al. |
| 8,217,414 B2 | 7/2012 | Hayashi |
| 8,324,654 B2 | 12/2012 | An et al. |
| 8,362,512 B2 | 1/2013 | Hussell et al. |
| 8,362,605 B2 | 1/2013 | Hui et al. |
| 8,367,945 B2 | 2/2013 | Cheong et al. |
| 8,368,112 B2 | 2/2013 | Chan et al. |
| 8,431,423 B2 | 4/2013 | Basin et al. |
| 8,541,797 B2 | 9/2013 | Hoelen et al. |
| 8,563,339 B2 | 10/2013 | Tarsa et al. |
| 8,564,004 B2 | 10/2013 | Tarsa et al. |
| 8,614,456 B2 * | 12/2013 | Leising | H01L 33/486 |
| | | | 257/79 |
| 8,669,572 B2 | 3/2014 | Leung et al. |
| 8,735,920 B2 | 5/2014 | Tarsa et al. |
| 8,748,915 B2 | 6/2014 | Chan et al. |
| 8,791,471 B2 | 7/2014 | Lueng |
| 8,866,169 B2 | 10/2014 | Emerson et al. |
| 9,035,439 B2 | 5/2015 | Xuan et al. |
| 9,070,850 B2 | 6/2015 | Keller et al. |
| 2002/0015013 A1 | 2/2002 | Ragle |
| 2002/0021085 A1 | 2/2002 | Ng |
| 2002/0030194 A1 | 3/2002 | Camras et al. |
| 2002/0054495 A1 | 5/2002 | Natsume |
| 2002/0061174 A1 | 5/2002 | Hurt et al. |
| 2002/0123163 A1 | 9/2002 | Fujii |
| 2002/0130405 A1 | 9/2002 | Kobayashi et al. |
| 2002/0163001 A1 | 11/2002 | Shaddock |
| 2002/0171911 A1 | 11/2002 | Maegawa |
| 2002/0195935 A1 | 12/2002 | Jager |
| 2003/0015708 A1 | 1/2003 | Parikh et al. |
| 2003/0020069 A1 | 1/2003 | Holmes et al. |
| 2003/0116769 A1 | 6/2003 | Song et al. |
| 2003/0141506 A1 * | 7/2003 | Sano | B82Y 20/00 |
| | | | 257/78 |
| 2003/0160256 A1 | 8/2003 | Durocher et al. |
| 2003/0165169 A1 | 9/2003 | Nomoto et al. |
| 2003/0183852 A1 | 10/2003 | Takenaka |
| 2004/0016938 A1 | 1/2004 | Baretz et al. |
| 2004/0037076 A1 | 2/2004 | Katoh et al. |
| 2004/0041222 A1 | 3/2004 | Loh |
| 2004/0047151 A1 | 3/2004 | Bogner et al. |
| 2004/0061120 A1 | 4/2004 | Mizuyoshi |
| 2004/0079957 A1 * | 4/2004 | Andrews et al. | 257/100 |
| 2004/0080251 A1 | 4/2004 | Steranka |
| 2004/0090174 A1 | 5/2004 | Tasch et al. |
| 2004/0207313 A1 | 10/2004 | Omoto et al. |
| 2004/0217364 A1 | 11/2004 | Tarsa et al. |
| 2004/0227149 A1 | 11/2004 | Ibbetson |
| 2004/0232435 A1 | 11/2004 | Hofer |
| 2004/0238930 A1 | 12/2004 | Arndt |
| 2004/0256706 A1 | 12/2004 | Nakashima |
| 2005/0023548 A1 | 2/2005 | Bhat |
| 2005/0035366 A1 | 2/2005 | Imai |
| 2005/0072981 A1 | 4/2005 | Suenaga |
| 2005/0077535 A1 | 4/2005 | Li |
| 2005/0082574 A1 | 4/2005 | Tasch et al. |
| 2005/0093005 A1 | 5/2005 | Ruhnau |
| 2005/0093430 A1 | 5/2005 | Ibbetson et al. |
| 2005/0110033 A1 | 5/2005 | Heremans et al. |
| 2005/0117320 A1 | 6/2005 | Leu |
| 2005/0127377 A1 | 6/2005 | Arndt |
| 2005/0135105 A1 | 6/2005 | Teixeira et al. |
| 2005/0173692 A1 | 8/2005 | Park et al. |
| 2005/0179041 A1 * | 8/2005 | Harbers et al. | 257/80 |
| 2005/0179376 A1 | 8/2005 | Fung et al. |
| 2005/0199899 A1 * | 9/2005 | Lin | H01L 25/0753 |
| | | | 257/99 |
| 2005/0205974 A1 | 9/2005 | Su et al. |
| 2005/0212397 A1 * | 9/2005 | Murazaki | C09K 11/0883 |
| | | | 313/487 |
| 2005/0212405 A1 * | 9/2005 | Negley | H01L 33/54 |
| | | | 313/502 |
| 2005/0221519 A1 | 9/2005 | Su et al. |
| 2005/0221518 A1 | 10/2005 | Andrews et al. |
| 2005/0231983 A1 | 10/2005 | Dahm |

(56) References Cited

U.S. PATENT DOCUMENTS

| | | | |
|---|---|---|---|
| 2005/0253130 A1 | 11/2005 | Tsutsumi et al. | |
| 2005/0265987 A1 | 12/2005 | Loh et al. | |
| 2005/0269587 A1 | 12/2005 | Loh | |
| 2006/0006404 A1 | 1/2006 | Ibbetson | |
| 2006/0022212 A1 | 2/2006 | Waitl | |
| 2006/0034576 A1 | 2/2006 | Merritt et al. | |
| 2006/0049422 A1 | 3/2006 | Shoji | |
| 2006/0049477 A1 | 3/2006 | Arndt | |
| 2006/0054912 A1 | 3/2006 | Murakami et al. | |
| 2006/0060867 A1 | 3/2006 | Suehirom | |
| 2006/0063287 A1* | 3/2006 | Andrews | H01L 33/62 438/22 |
| 2006/0076568 A1 | 4/2006 | Keller et al. | |
| 2006/0081862 A1 | 4/2006 | Chua et al. | |
| 2006/0091406 A1 | 5/2006 | Kaneko et al. | |
| 2006/0102917 A1 | 5/2006 | Cyama et al. | |
| 2006/0105478 A1* | 5/2006 | Camras et al. | 438/22 |
| 2006/0105485 A1 | 5/2006 | Basin et al. | |
| 2006/0108594 A1 | 5/2006 | Iwasaki et al. | |
| 2006/0118775 A1* | 6/2006 | Nagai | H01L 33/32 257/13 |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0152926 A1* | 7/2006 | Hama | A61B 1/0017 362/231 |
| 2006/0157725 A1* | 7/2006 | Flaherty | 257/99 |
| 2006/0157828 A1 | 7/2006 | Sorg | |
| 2006/0158899 A1 | 7/2006 | Ayabe et al. | |
| 2006/0180818 A1* | 8/2006 | Nagai | F21K 9/00 257/89 |
| 2006/0180925 A1 | 8/2006 | Lee et al. | |
| 2006/0186418 A1 | 8/2006 | Edmond et al. | |
| 2006/0198418 A1* | 9/2006 | Hama | A61B 1/00096 372/108 |
| 2006/0220046 A1 | 10/2006 | Yu | |
| 2006/0255355 A1 | 11/2006 | Brunner et al. | |
| 2006/0267031 A1 | 11/2006 | Tasch et al. | |
| 2006/0267042 A1 | 11/2006 | Izuno et al. | |
| 2006/0278882 A1 | 12/2006 | Leung et al. | |
| 2006/0291185 A1 | 12/2006 | Atsushi | |
| 2007/0025231 A1 | 2/2007 | Ochiai et al. | |
| 2007/0046176 A1 | 3/2007 | Bukesov et al. | |
| 2007/0090383 A1 | 4/2007 | Ota et al. | |
| 2007/0096139 A1 | 5/2007 | Schultz | |
| 2007/0109779 A1 | 5/2007 | Sekiguchi et al. | |
| 2007/0139923 A1 | 6/2007 | Negley | |
| 2007/0145401 A1 | 6/2007 | Ikehara | |
| 2007/0170447 A1 | 7/2007 | Negley | |
| 2007/0170449 A1 | 7/2007 | Anandan | |
| 2007/0170450 A1 | 7/2007 | Murphy | |
| 2007/0241357 A1 | 10/2007 | Yan | |
| 2007/0262328 A1 | 11/2007 | Bando | |
| 2007/0262339 A1 | 11/2007 | Hussell et al. | |
| 2007/0269586 A1 | 11/2007 | Leatherdale | |
| 2007/0278506 A1* | 12/2007 | Tran | H01L 33/02 257/94 |
| 2007/0279903 A1 | 12/2007 | Negley | |
| 2007/0295975 A1 | 12/2007 | Omae | |
| 2008/0013319 A1 | 1/2008 | Pei et al. | |
| 2008/0026498 A1 | 1/2008 | Tarsa et al. | |
| 2008/0036364 A1 | 2/2008 | Li et al. | |
| 2008/0041625 A1 | 2/2008 | Cheong et al. | |
| 2008/0079017 A1 | 4/2008 | Loh | |
| 2008/0084685 A1 | 4/2008 | Van de Ven | |
| 2008/0084701 A1 | 4/2008 | Van de Ven | |
| 2008/0089053 A1 | 4/2008 | Negley | |
| 2008/0093606 A1 | 4/2008 | Pan et al. | |
| 2008/0112168 A1 | 5/2008 | Pickard et al. | |
| 2008/0121921 A1 | 5/2008 | Loh et al. | |
| 2008/0130282 A1 | 6/2008 | Negley | |
| 2008/0137347 A1 | 6/2008 | Trott | |
| 2008/0149960 A1 | 6/2008 | Amo et al. | |
| 2008/0170391 A1 | 7/2008 | Norfidathul et al. | |
| 2008/0173884 A1 | 7/2008 | Chitnis et al. | |
| 2008/0179611 A1* | 7/2008 | Chitnis | H01L 33/508 257/98 |
| 2008/0186702 A1 | 8/2008 | Camras et al. | |
| 2008/0191232 A1 | 8/2008 | Lee et al. | |
| 2008/0198594 A1 | 8/2008 | Lee | |
| 2008/0230790 A1 | 9/2008 | Seko et al. | |
| 2008/0258130 A1 | 10/2008 | Bergmann et al. | |
| 2008/0258156 A1 | 10/2008 | Hata | |
| 2008/0258168 A1* | 10/2008 | Loh et al. | 257/99 |
| 2008/0265268 A1 | 10/2008 | Braun et al. | |
| 2008/0296590 A1 | 12/2008 | Ng | |
| 2008/0298063 A1 | 12/2008 | Hayashi | |
| 2008/0303052 A1 | 12/2008 | Lee et al. | |
| 2008/0308825 A1 | 12/2008 | Chakraborty et al. | |
| 2009/0020774 A1 | 1/2009 | Park | |
| 2009/0021841 A1 | 1/2009 | Negley | |
| 2009/0050907 A1 | 2/2009 | Yuan | |
| 2009/0050908 A1 | 2/2009 | Yuan et al. | |
| 2009/0050911 A1 | 2/2009 | Chakraborty | |
| 2009/0050924 A1 | 2/2009 | Edmond | |
| 2009/0057699 A1 | 3/2009 | Basin | |
| 2009/0057708 A1 | 3/2009 | Abdul et al. | |
| 2009/0072251 A1 | 3/2009 | Chan et al. | |
| 2009/0078948 A1 | 3/2009 | Hoelen et al. | |
| 2009/0095966 A1* | 4/2009 | Keller et al. | 257/98 |
| 2009/0108281 A1* | 4/2009 | Keller et al. | 257/98 |
| 2009/0129085 A1 | 5/2009 | Aizar et al. | |
| 2009/0152573 A1 | 6/2009 | Loh | |
| 2009/0189178 A1 | 7/2009 | Kim et al. | |
| 2009/0231835 A1 | 9/2009 | Roberts | |
| 2009/0231856 A1 | 9/2009 | Householder | |
| 2009/0236618 A1 | 9/2009 | Yasuda | |
| 2009/0283781 A1 | 11/2009 | Chan et al. | |
| 2010/0001299 A1 | 1/2010 | Chang et al. | |
| 2010/0044735 A1 | 2/2010 | Oyamada | |
| 2010/0052126 A1 | 3/2010 | Hui et al. | |
| 2010/0090233 A1 | 4/2010 | Hussell et al. | |
| 2010/0103660 A1 | 4/2010 | Van de Ven et al. | |
| 2010/0105172 A1* | 4/2010 | Li | H01L 24/83 438/118 |
| 2010/0117099 A1 | 5/2010 | Leung | |
| 2010/0133002 A1 | 6/2010 | Xuan et al. | |
| 2010/0140648 A1 | 6/2010 | Harada et al. | |
| 2010/0193822 A1 | 8/2010 | Inobe et al. | |
| 2010/0200887 A1 | 8/2010 | Urano et al. | |
| 2010/0252851 A1 | 10/2010 | Emerson | |
| 2011/0049545 A1 | 3/2011 | Besin et al. | |
| 2011/0108874 A1 | 5/2011 | Chu et al. | |
| 2011/0121345 A1 | 5/2011 | Andrews et al. | |
| 2011/0186880 A1 | 8/2011 | Kohler et al. | |
| 2011/0193118 A1 | 8/2011 | Oshima et al. | |
| 2011/0248287 A1 | 10/2011 | Yuan | |
| 2011/0278617 A1 | 11/2011 | Lee | |
| 2012/0002419 A1* | 1/2012 | Zaderej et al. | 362/249.02 |
| 2012/0235199 A1 | 9/2012 | Andrews et al. | |
| 2012/0257386 A1 | 10/2012 | Harbers et al. | |

FOREIGN PATENT DOCUMENTS

| | | |
|---|---|---|
| CN | 2 498 694 Y | 7/2002 |
| CN | 2498694 | 7/2002 |
| CN | 2 549 313 Y | 5/2003 |
| CN | 2549313 | 5/2003 |
| CN | 2 646 873 Y | 10/2004 |
| CN | 2646873 | 10/2004 |
| CN | 1 581 527 A | 2/2005 |
| CN | 1581527 | 2/2005 |
| CN | 1 591 924 A | 3/2005 |
| CN | 1591924 | 3/2005 |
| CN | 1 679 168 A | 10/2005 |
| CN | 1679168 | 10/2005 |
| CN | 1 720 608 A | 1/2006 |
| CN | 1720608 | 1/2006 |
| CN | 1 744 335 A | 3/2006 |
| CN | 1744335 | 3/2006 |
| CN | 1 801 498 A | 7/2006 |
| CN | 1801498 | 7/2006 |
| CN | 1 874 011 A | 12/2006 |

(56) References Cited

FOREIGN PATENT DOCUMENTS

| | | |
|---|---|---|
| CN | 1874011 | 12/2006 |
| CN | 1 913 135 | 2/2007 |
| CN | 1913135 | 2/2007 |
| CN | 101 005 109 A | 7/2007 |
| CN | 101005109 | 7/2007 |
| CN | 101 013 689 A | 8/2007 |
| CN | 101013689 | 8/2007 |
| CN | 101 061 590 A | 10/2007 |
| CN | 101061590 A | 10/2007 |
| CN | 101 360 368 A | 2/2009 |
| CN | 101360368 | 2/2009 |
| DE | 20 2007 012 162 U1 | 4/2008 |
| DE | 202007012162 | 4/2008 |
| EP | 0 684 648 A2 | 11/1995 |
| EP | 0684648 | 11/1995 |
| EP | 0 936 682 A1 | 8/1999 |
| EP | 0936682 | 8/1999 |
| EP | 1 005 085 A2 | 5/2000 |
| EP | 1005085 A2 | 5/2000 |
| EP | 1 187 226 A1 | 3/2002 |
| EP | 1 187 227 A2 | 3/2002 |
| EP | 1 187 228 A1 | 3/2002 |
| EP | 1187226 A1 | 3/2002 |
| EP | 1187227 | 3/2002 |
| EP | 1187228 | 3/2002 |
| EP | 1 349 202 A2 | 10/2003 |
| EP | 1349202 A | 10/2003 |
| EP | 1 521 313 A2 | 4/2005 |
| EP | 1521313 | 4/2005 |
| EP | 1 536 487 A1 | 6/2005 |
| EP | 1536487 A1 | 6/2005 |
| EP | 1 653 254 A2 | 5/2006 |
| EP | 1 653 255 A2 | 5/2006 |
| EP | 1653254 | 5/2006 |
| EP | 1653255 | 5/2006 |
| EP | 1 681 509 A1 | 7/2006 |
| EP | 1681509 | 7/2006 |
| EP | 1 693 904 A2 | 8/2006 |
| EP | 1693904 | 8/2006 |
| EP | 1 864 780 A2 | 12/2007 |
| EP | 1864780 | 12/2007 |
| FR | 2 586 844 A1 | 3/1987 |
| FR | 2586844 | 3/1987 |
| FR | 2 759 188 A1 | 8/1998 |
| FR | 2759188 | 8/1998 |
| FR | 2 814 220 A1 | 3/2002 |
| FR | 2814220 | 3/2002 |
| GB | 2420221 A | 12/2004 |
| GB | 2 420 221 A | 5/2006 |
| GB | 2 466 633 A | 7/2010 |
| GB | 2466633 | 7/2010 |
| JP | S53-118019 A | 10/1978 |
| JP | S53118019 | 10/1978 |
| JP | S 53126570 | 10/1978 |
| JP | 59-027559 | 2/1984 |
| JP | S59-27559 A | 2/1984 |
| JP | 61-048951 | 3/1986 |
| JP | 61-48951 A | 3/1986 |
| JP | S 62160564 | 3/1986 |
| JP | 62-047156 | 2/1987 |
| JP | 62-47156 | 2/1987 |
| JP | 62140758 | 9/1987 |
| JP | 038459 | 1/1991 |
| JP | 03-171780 | 7/1991 |
| JP | 06-177424 | 6/1994 |
| JP | 07-202271 | 8/1995 |
| JP | 0832120 | 2/1996 |
| JP | 51-048951 | 3/1996 |
| JP | 5148951 | 3/1996 |
| JP | 8139257 | 5/1996 |
| JP | H 08-139 257 A | 5/1996 |
| JP | 10-135492 | 5/1998 |
| JP | 10-321909 | 12/1998 |
| JP | H11-54802 A | 2/1999 |
| JP | 11-167805 A | 6/1999 |
| JP | 2000-188358 | 7/2000 |
| JP | 2000-223752 | 8/2000 |
| JP | 2000/223752 | 8/2000 |
| JP | 2000-261041 | 9/2000 |
| JP | 2001-044506 | 2/2001 |
| JP | 2001-168400 | 6/2001 |
| JP | 2001-237463 | 8/2001 |
| JP | 2002-009217 | 1/2002 |
| JP | 2002-223005 | 8/2002 |
| JP | 2002-374005 | 12/2002 |
| JP | 2003-197974 | 7/2003 |
| JP | 2003-264267 | 9/2003 |
| JP | 2003-318449 | 11/2003 |
| JP | 2003-324214 | 11/2003 |
| JP | 2004-022862 | 1/2004 |
| JP | 2004-056075 | 2/2004 |
| JP | 2004-103775 | 2/2004 |
| JP | 2004-507114 | 3/2004 |
| JP | 2004-111937 A | 4/2004 |
| JP | 2004-200236 | 7/2004 |
| JP | 2004-228387 | 8/2004 |
| JP | 2004-228387 A | 8/2004 |
| JP | 2004-327955 | 11/2004 |
| JP | 2004-335740 | 11/2004 |
| JP | 2004-3474480 | 11/2004 |
| JP | 2004335880 | 11/2004 |
| JP | 2004-342870 | 12/2004 |
| JP | 2005-019838 | 1/2005 |
| JP | 2005-19838 A | 1/2005 |
| JP | 2005-079167 | 3/2005 |
| JP | 2005-223222 | 8/2005 |
| JP | 2005-259754 | 9/2005 |
| JP | 2005-259972 | 9/2005 |
| JP | 2005-310935 | 11/2005 |
| JP | 2005-347401 | 12/2005 |
| JP | 2005-539386 | 12/2005 |
| JP | 2006-019557 | 1/2006 |
| JP | 2006-508537 | 3/2006 |
| JP | 2006-509372 | 3/2006 |
| JP | 2006-108517 | 4/2006 |
| JP | 2006-119357 | 5/2006 |
| JP | 2006-179520 | 7/2006 |
| JP | 2006-253689 | 9/2006 |
| JP | 2006-324331 | 11/2006 |
| JP | 2006-332234 | 12/2006 |
| JP | 2006/344692 | 12/2006 |
| JP | 2007-094088 | 4/2007 |
| JP | 2007-509505 | 4/2007 |
| JP | 2007-165029 | 6/2007 |
| JP | 2007-165840 | 6/2007 |
| JP | 2007-184542 | 7/2007 |
| JP | 2007-243226 | 9/2007 |
| JP | 2007-273763 | 10/2007 |
| JP | 2007-287981 | 11/2007 |
| JP | 2007-299905 | 11/2007 |
| JP | 2007-329516 | 11/2007 |
| JP | 2007-317896 | 12/2007 |
| JP | 2007-329516 | 12/2007 |
| JP | 2008/518461 | 5/2008 |
| JP | 2008/521236 | 6/2008 |
| JP | 2004-146815 | 5/2014 |
| RU | 2251761 | 2/2005 |
| TV | 352241 | 7/2008 |
| TW | 160799 | 6/1991 |
| TW | 171255 | 10/1991 |
| TW | 352241 | 7/2008 |
| WO | WO 9856043 | 12/1998 |
| WO | WO 9931737 | 6/1999 |
| WO | WO 0211212 A | 2/2002 |
| WO | WO 0217405 | 2/2002 |
| WO | WO 03044870 | 5/2003 |
| WO | WO 03049204 | 6/2003 |
| WO | WO 2004/036660 | 4/2004 |
| WO | WO 04027882 | 4/2004 |
| WO | WO 04044877 | 5/2004 |
| WO | WO 2004/053933 A2 | 6/2004 |
| WO | WO 2004/107461 | 12/2004 |
| WO | WO 05043627 | 5/2005 |
| WO | WO 05104247 | 11/2005 |

(56) References Cited

FOREIGN PATENT DOCUMENTS

| | | |
|---|---|---|
| WO | WO 2006/016398 | 2/2006 |
| WO | WO 2006/046981 | 5/2006 |
| WO | WO 2006/048064 A1 | 5/2006 |
| WO | WO 2006-054228 | 5/2006 |
| WO | WO 06054228 A2 | 5/2006 |
| WO | WO 06054228 A3 | 5/2006 |
| WO | WO 2006-054228 | 6/2006 |
| WO | WO 2006-135502 | 12/2006 |
| WO | WO 07005844 A | 1/2007 |
| WO | WO 2007/083408 A1 | 7/2007 |
| WO | WO 2007-121486 | 10/2007 |
| WO | WO 2007/122516 | 11/2007 |
| WO | WO 2008/082098 | 6/2008 |
| WO | WO 2008/081696 | 7/2008 |
| WO | WO 2008/081794 | 7/2008 |
| WO | WO 2008/082098 | 7/2008 |
| WO | WO 2009/074919 A1 | 6/2009 |
| WO | WO 2010/005294 | 1/2010 |
| WO | WO 2012-099145 | 7/2012 |

OTHER PUBLICATIONS

Advisory Action for U.S. Appl. No. 11/149,998 dated Nov. 30, 2011.
Advisory Action for U.S. Appl. No. 11/465,120 dated May 4, 2009.
Advisory Action for U.S. Appl. No. 11/465,120 dated Nov. 16, 2010.
Advisory Action for U.S. Appl. No. 11/496,922 dated Apr. 8, 2010.
Advisory Action for U.S. Appl. No. 11/496,922 dated Sep. 10, 2013.
Advisory Action for U.S. Appl. No. 11/496,922 mailed Apr. 18, 2012.
Advisory Action for U.S. Appl. No. 11/600,617 dated Oct. 20, 2009.
Advisory Action for U.S. Appl. No. 11/982,275 dated Dec. 23, 2014.
Advisory Action for U.S. Appl. No. 11/982,275 dated Jul. 5, 2013.
Advisory Action for U.S. Appl. No. 12/002,410 dated Apr. 10, 2014.
Advisory Action for U.S. Appl. No. 12/002,410 dated Aug. 28, 2015.
Advisory Action for U.S. Appl. No. 12/002,410 dated Aug. 30, 2016.
Advisory Action for U.S. Appl. No. 12/002,410 dated Jul. 26, 2010.
Advisory Action for U.S. Appl. No. 12/002,410 dated Jun. 14, 2012.
Advisory Action for U.S. Appl. No. 12/002,410 dated Jun. 21, 2011.
Advisory Action for U.S. Appl. No. 12/069,827 dated Aug. 28, 2015.
Advisory Action for U.S. Appl. No. 12/069,827 dated Feb. 7, 2013.
Advisory Action for U.S. Appl. No. 12/069,827 dated Jan. 12, 2015.
Advisory Action for U.S. Appl. No. 12/069,827 dated Jan. 6, 2011.
Advisory Action for U.S. Appl. No. 12/069,827 dated Jun. 12, 2012.
Advisory Action for U.S. Appl. No. 12/069,827 dated May 17, 2016.
Advisory Action for U.S. Appl. No. 12/069,827 dated Sep. 11, 2013.
Advisory Action for U.S. Appl. No. 12/069,827 dated Sep. 7, 2011.
Advisory Action for U.S. Appl. No. 12/291,293 dated Nov. 9, 2010.
Advisory Action for U.S. Appl. No. 12/291,293 dated Oct. 28, 2013.
Advisory Action for U.S. Appl. No. 12/291,293 dated Sep. 21, 2011.
Advisory Action for U.S. Appl. No. 12/321,059 dated Aug. 26, 2011.
Advisory Action for U.S. Appl. No. 12/321,059 dated Dec. 6, 2010.
Advisory Action for U.S. Appl. No. 12/695,978 dated Aug. 19, 2014.
Advisory Action for U.S. Appl. No. 12/695,978 dated Nov. 14, 2013.
Advisory Action for U.S. Appl. No. 12/757,179 dated Jul. 24, 2013.
Advisory Action for U.S. Appl. No. 12/757,891 dated Feb. 4, 2013.
Advisory Action for U.S. Appl. No. 13/652,241 dated Sep. 8, 2016.
Advisory Action for U.S. Appl. No. 12/875,873 dated Aug. 19, 2014.
Advisory Action for U.S. Appl. No. 12/875,873 dated Dec. 13, 2013.
Advisory Action for U.S. Appl. No. 12/875,873 dated May 2, 2013.
Advisory Action for U.S. Appl. No. 12/875,873 dated May 7, 2015.
Advisory Action from U.S. Appl. No. 12/321,059 dated Apr. 20, 2012.
Appeal board's Questioning from Japanese Patent Application No. 2011/545616 dated Nov. 12, 2013.
Appeal Decision from Japanese Patent Application No. 2008/515699 dated Sep. 20, 2013.
Applicant Initiated Interview Summary for U.S. Appl. No. 12/069,827 dated Apr. 19, 2016.
Applicant Initiated Interview Summary for U.S. Appl. No. 12/875,873 dated May 23, 2016.
Applicant Initiated Interview Summary for U.S. Appl. No. 12/875,873 dated Sep. 28, 2015.
Applicant Initiated Interview Summary for U.S. Appl. No. 12/875,873 dated Sep. 23, 2015.
Applicant Initiated Interview Summary for U.S. Appl. No. 13/652,241 dated Feb. 17, 2016.
Applicant-nitiated Interview Summary for U.S. Appl. No. 12/002,410 dated Feb. 23, 2016.
Canadian Patent Application No. 2,454,310, Office Action dated Feb. 9, 2010.
Communication from European Patent Appl No. 09824413.0/1551. dated Feb. 28. 2013.
Cree XLamp® MC-E LED data page retrieved at http://www.cree.com/products/xlamp_mce.asp on Sep. 15, 2010, pp. 1-3.
Cree XLamp® XP-E LED data page, retrieved at http://www.cree.com/products/xlamp_xpe.asp on Sep. 15, 2010, pp. 1-4.
Cree XLamp® XP-G LED data page retrieved at http://www.cree.com/products/xlamp_xpg.asp on Sep. 15, 2010, pp. 1-3.
Cree XLamp® XR-C LEDs data page, retrieved at <http://www.cree.com/products/xlamp_xrc.asp> on Sep. 15, 2010, pp. 1-3.
Cree XLamp® XR-E LEDs data page, retrieved at <http://www.cree.com/products/xlamp7090_xre.asp> on Sep. 15, 2010, pp. 1-3.
Decision of Re-Examination from Chinese Patent Application No. 201110039138.9 dated Mar. 13, 2014.
Decision of Registration from Japanese Design Application No. 2012/030304 dated Jan. 21, 2014.
Decision of Rejection from Chinese Patent Application No. 200880009255.7 dated Sep. 5, 2012.
Decision of Rejection from Chinese Patent Application No. 201001067346.2 dated Aug. 30, 2013.
Decision of Rejection from Chinese Patent Application No. 201080001658.4 dated Jun. 20, 2013.
Decision of Rejection from Chinese Patent Application No. 201110039138.9 dated Sep. 25, 2013.
Decision of Rejection from Japanese Patent Appl No. 2008-281533. dated May 28. 2013.
Decision of ReJection from Japanese Patent Application No. 2009 50719 5. dated May 21, 2013.
Decision of Rejection from Japanese Patent Application No. 2008-515699 dated Jul. 17, 2012.
Decision of Rejection from Japanese Patent Application No. 2011/259253 dated Mar. 25, 2014.
Decision of Rejection from Japanese Patent Application No. 2011-545616 dated Apr. 26. 2013.
Decision on Appeal from Japanese Patent Application No. 2011-545616 dated Jun. 27, 2014.
Decision on Rejection from Chinese Patent Application No. 2007101521097 dated Mar. 17, 2014.
European Search Report from European Patent Appl. No. 09824413.0/1551 dated Feb. 11, 2013.
Examination from European Patent Application No. 09 824 413-1551 dated May 16, 2014.
Examination Report from European Patent Application No. 07789665.2 dated Aug. 20, 2012.
Extended European Search Report for European Patent Application No. 08253519.6 dated Aug. 13, 2014.
Extended Search Report for European Patent Application No. 09824413.0-1551 dated Feb. 11, 2013.
Fifth Office Action from Chinese Patent Application No. 2007/10152109.7 dated Jan. 6, 2014.

(56) References Cited

OTHER PUBLICATIONS

Final Office Action for U.S. Appl. No. 11/149,998 dated Aug. 17, 2007.
Final Office Action for U.S. Appl. No. 11/149,998 dated Jul. 14, 2009.
Final Office Action for U.S. Appl. No. 11/149,998 dated Jul. 21, 2008.
Final Office Action for U.S. Appl. No. 11/149,998 dated Jul. 26, 2013.
Final Office Action for U.S. Appl. No. 11/149,998 dated Sep. 21, 2011.
Final Office Action for U.S. Appl. No. 11/465,120 dated Feb. 20, 2009.
Final Office Action for U.S. Appl. No. 11/465,120 dated Jun. 14, 2011.
Final Office Action for U.S. Appl. No. 11/496,922 dated Feb. 17, 2009.
Final Office Action for U.S. Appl. No. 11/496,922 dated Jan. 27, 2010.
Final Office Action for U.S. Appl. No. 11/600,617 dated Jul. 8, 2009.
Final Office Action for U.S. Appl. No. 11/982,275 dated Jan. 7, 2014.
Final Office Action for U.S. Appl. No. 11/982,275 dated Oct. 15, 2014.
Final Office Action for U.S. Appl. No. 12/002,410 dated Jun. 14, 2016.
Final Office Action for U.S. Appl. No. 12/002,410 dated Jun. 17, 2015.
Final Office Action for U.S. Appl. No. 12/002,410 dated Nov. 4, 2014.
Final Office Action for U.S. Appl. No. 12/069,827 dated Jul. 3, 2013.
Final Office Action for U.S. Appl. No. 12/069,827 dated Jun. 19, 2015.
Final Office Action for U.S. Appl. No. 12/069,827 dated Mar. 1, 2016.
Final Office Action for U.S. Appl. No. 12/069,827 dated Oct. 28, 2014.
Final Office Action for U.S. Appl. No. 12/291,293 dated Aug. 20, 2013.
Final Office Action for U.S. Appl. No. 12/291,293 dated Jul. 19, 2011.
Final Office Action for U.S. Appl. No. 12/291,293 dated Sep. 3, 2010.
Final Office Action for U.S. Appl. No. 12/321,059 dated Jun. 22, 2011.
Final Office Action for U.S. Appl. No. 12/321,059 dated Sep. 24, 2010.
Final Office Action for U.S. Appl. No. 12/635,818 dated Mar. 14, 2011.
Final Office Action for U.S. Appl. No. 12/695,978 dated Jul. 16, 2014.
Final Office Action for U.S. Appl. No. 12/695,978 dated Sep. 17, 2013.
Final Office Action for U.S. Appl. No. 12/757,179 dated Jul. 15, 2014.
Final Office Action for U.S. Appl. No. 12/875,873 dated Feb. 9, 2017.
Final Office Action for U.S. Appl. No. 12/875,873 dated Mar. 2, 2015.
Final Office Action for U.S. Appl. No. 13/652,241 dated Jul. 1, 2016.
Final Office Action for U.S. Appl. No. 13/652,241 dated Nov. 19, 2014.
Final Office Action for U.S. Appl. No. 13/652,241 dated Sep. 11, 2015.
Final Office Action for U.S. Appl. No. 12/875,873 dated Jan. 29, 2016.
Final Office Action for U.S. Appl. No. 13/652,241 dated Mar. 12, 2014.
Final Office Action from U.S. Appl. No. 12/757,179 dated Jun. 7, 2013.
First Office Action for Chinese Patent Application No. 201110039138.9 dated Jun. 4, 2012.
First Office Action from Chinese Patent Application No. 201080001658.4 dated Sep. 24, 2012.
First Office Action from Chinese Patent Application No. 201080027586.0 dated Feb. 8, 2014.
International Preliminary Report on Patentability from PCT/US2012/065060 dated Jun. 12, 2014.
International Search Report and Written Opinion from PCT application No. PCT/US2012/065060, dated Feb. 20, 2013.
International Search Report and Written Opinion from PCT/CN2010/001009 dated Oct. 21, 2010.
International Search Report and Written Opinion from PCT/US2013/073921 dated Feb. 18, 2014.
Interrogation from Japanese Patent Application No. 2007-211901 dated Aug. 21, 2012.
Interrogation from Japanese Patent Application No. 2008 515699. dated Feb. 19, 2013.
Interrogation from Japanese Patent Application No. 2008/281533 dated Jan. 21, 2014.
Interrogation from Japanese Patent Application No. 2009/507195 dated Jan. 28, 2014.
Nichia Corporation LEDs, Specification for NESM06CT, 15 pages.
Nichia Corporation LEDs, Specification for NSSM026BBT, 15 pages.
Nichia Corporation LEDs, Specification for NSSM227AT, 15 pages.
Non Final Office Action for U.S. Appl. No. 11/149,998 dated Feb. 5, 2008.
Non Final Office Action for U.S. Appl. No. 11/149,998 dated Jan. 5, 2009.
Non Final Office Action for U.S. Appl. No. 11/149,998 dated Jan. 8, 2007.
Non Final Office Action for U.S. Appl. No. 11/465,120 dated Aug. 21, 2008.
Non Final Office Action for U.S. Appl. No. 11/465,120 dated Jul. 21, 2009.
Non Final Office Action for U.S. Appl. No. 11/496,922 dated Jul. 5, 2011.
Non Final Office Action for U.S. Appl. No. 11/496,922 dated Jul. 2, 2009.
Non Final Office Action for U.S. Appl. No. 11/496,922 dated Jul. 21, 2008.
Non Final Office Action for U.S. Appl. No. 11/600,617 dated Dec. 19, 2008.
Non Final Office Action for U.S. Appl. No. 11/600,617 dated Jun. 11, 2008.
Non Final Office Action for U.S. Appl. No. 12/002,410 dated Feb. 23, 2015.
Non Final Office Action for U.S. Appl. No. 12/002,410 dated Nov. 30, 2015.
Non Final Office Action for U.S. Appl. No. 12/002,410 dated Nov. 5, 2009.
Non Final Office Action for U.S. Appl. No. 12/002,410 dated Sep. 25, 2012.
Non Final Office Action for U.S. Appl. No. 12/291,293 dated Dec. 31, 2013.
Non-Final Office Action and Examiner Initiated Interview Summary for U.S. Appl. No. 12/069,827 dated Jul. 14, 2016.
Non-Final Office Action for U.S. Appl. No. 11/982,275 dated Mar. 23, 2012.
Non-Final Office Action for U.S. Appl. No. 12/069,827 dated Aug. 9, 2012.
Non-Final Office Action for U.S. Appl. No. 12/069,827 dated Feb. 6, 2015.
Non-Final Office Action for U.S. Appl. No. 12/069,827 dated Jun. 16, 2011.
Non-Final Office Action for U.S. Appl. No. 12/069,827 dated Mar. 5, 2013.

(56) References Cited

OTHER PUBLICATIONS

Non-Final Office Action for U.S. Appl. No. 12/069,827 dated Nov. 12, 2015.
Non-Final Office Action for U.S. Appl. No. 12/069,827 dated Oct. 26, 2011.
Non-Final Office Action for U.S. Appl. No. 12/291,293 dated Mar. 1, 2011.
Non-Final Office Action for U.S. Appl. No. 12/321,059 dated Feb. 11, 2011.
Non-Final Office Action for U.S. Appl. No. 12/321,059 dated Oct. 4, 2011.
Non-Final Office Action for U.S. Appl. No. 12/614,989 dated Mar. 12, 2012.
Non-Final Office Action for U.S. Appl. No. 12/635,818 dated Jul. 15, 2011.
Non-Final Office Action for U.S. Appl. No. 12/635,818 dated Nov. 17, 2011.
Non-Final Office Action for U.S. Appl. No. 12/635,818 dated Oct. 14, 2010.
Non-Final Office Action for U.S. Appl. No. 12/695,978 dated Jan. 31, 2014.
Non-Final Office Action for U.S. Appl. No. 12/695,978 dated Sep. 14, 2011.
Non-Final Office Action for U.S. Appl. No. 12/757,179 dated Mar. 11, 2014.
Non-Final Office Action for U.S. Appl. No. 12/757,179 dated Oct. 3, 2013.
Non-Final Office Action for U.S. Appl. No. 12/875,873 dated Aug. 12, 2016.
Non-Final Office Action for U.S. Appl. No. 12/875,873 dated Jun. 29, 2015.
Non-Final Office Action for U.S. Appl. No. 12/875,873 dated Oct. 3, 2014.
Non-Final Office Action for U.S. Appl. No. 13/652,241 dated Mar. 10, 2016.
Non-Final Office Action for U.S. Appl. No. 13/652,241 dated Mar. 17, 2015.
Non-Final Office Action for U.S. Appl. No. 13/652,241 dated Sep. 29, 2016.
Non-Final Office Action for U.S. Appl. No. 13/652,241 dated Sep. 11, 2014.
Notice of Allowance and Examiner Initiated Interview Summary for U.S. Appl. No. 12/321,059 dated Oct. 10, 2012.
Notice of Allowance and Interview Summary for U.S. Appl. No. 12/757,179 dated Mar. 17, 2015.
Notice of Allowance for U.S. Appl. No. 11/149,998 dated Oct. 21, 2013.
Notice of Allowance for U.S. Appl. No. 11/465,120 dated Oct. 4, 2012.
Notice of Allowance for U.S. Appl. No. 11/496,922 dated Apr. 24, 2014.
Notice of Allowance for U.S. Appl. No. 11/496,922 dated Jan. 13, 2014.
Notice of Allowance for U.S. Appl. No. 11/600,617 dated Jun. 11, 2010.
Notice of Allowance for U.S. Appl. No. 11/982,275 dated Apr. 2, 2015.
Notice of Allowance for U.S. Appl. No. 11/982,275 dated Feb. 17, 2015.
Notice of Allowance for U.S. Appl. No. 11/982,275 dated May 11, 2015.
Notice of Allowance for U.S. Appl. No. 12/152,766 dated Aug. 31, 2011.
Notice of Allowance for U.S. Appl. No. 12/154,691 dated Jun. 17, 2010.
Notice of Allowance for U.S. Appl. No. 12/291,293 dated Jun. 24, 2014.
Notice of Allowance for U.S. Appl. No. 12/291,293 dated Mar. 27, 2014.
Notice of Allowance for U.S. Appl. No. 12/291,293 dated May 16, 2014.
Notice of Allowance for U.S. Appl. No. 12/291,293 dated May 29, 2014.
Notice of Allowance for U.S. Appl. No. 12/614,989 dated Dec. 20, 2012.
Notice of Allowance for U.S. Appl. No. 12/614,989 dated Sep. 17, 2012.
Notice of Allowance for U.S. Appl. No. 12/635,818 dated May 15, 2012.
Notice of Allowance for U.S. Appl. No. 12/635,818 dated Sep. 13, 2012.
Notice of Allowance for U.S. Appl. No. 12/695,978 dated Dec. 4, 2014.
Notice of Allowance for U.S. Appl. No. 12/695,978 dated Mar. 18, 2015.
Notice of Allowance for U.S. Appl. No. 12/757,179 dated Dec. 17, 2014.
Notice of Allowance for U.S. Appl. No. 12/757,179 dated Feb. 23, 2015.
Notice of Allowance for U.S. Appl. No. 12/868,567 dated Jan. 15, 2014.
Notice of Allowance for U.S. Appl. No. 12/757,891 dated Aug. 13, 2014.
Notice of Allowance for U.S. Appl. No. 12/757,891 dated Jul. 10, 2014.
Notice of Allowance for U.S. Appl. No. 12/757,891 dated May 29, 2014.
Notice of Allowance for U.S. Appl. No. 12/757,891 dated Sep. 10, 2014.
Notice of Allowance for U.S. Appl. No. 13/652,241 dated Feb. 21, 2017.
Notice of Allowance for U.S. Appl. No. 13/652,241 dated Jan. 27, 2017.
Notice of Allowance for U.S. Appl. No. 13/652,241 dated May 3, 2017.
Notice of Allowance for U.S. Appl. No. 29/293,900 dated Jul. 21, 2010.
Notice of Allowance for U.S. Appl. No. 29/293,900 dated Sep. 24, 2010.
Notice of Allowance for U.S. Appl. No. 13/306,589 dated Jun. 26, 2013.
Notice of Reasons for Rejection for Japanese Patent Application No. JP 2008-515699 dated May 19, 2011.
Notice of Reasons for Rejection from Japanese Patent A.pplication No. 2007-211901, dated Apr. 9, 2013.
Notice of Reasons for Rejection from Japanese Patent Appl No. 2011-534993, dated Mar. 12, 2013.
Notice of Reasons for Rejection from Japanese Patent Appl. No. 2011 259253, dated May 28, 2013.
Notice of Reasons for Rejection from Japanese Patent Application No. 2011/534993 dated Nov. 12, 2013.
Notice of Reasons for Rejection from Japanese Patent Application No. 2007/211901 dated Oct. 8, 2013.
Notification of Allowance from Taiwanese Application No. 103202911 dated Jul. 16, 2014.
Notification of Designation of the Appeal Examiner from Japanese Patent Application No. 2009/507195 dated Jan. 22, 2014.
Notification of Loss of Rights from European Patent Application No. 09824413.0 dated Oct. 17, 2013.
Notification of Reexamination from Chinese Patent Application No. 200880092557 dated May 12, 2014.
Notification of the Second Office Action from Chinese Patent Application No. 201010167346.2 dated Feb. 17, 2013.
Office Action and Interview Summary for U.S. Appl. No. 13/652,241 dated Sep. 11, 2013.
Office Action and Search Report from Chinese Patent Application No. 2011200391389 dated Jun. 23, 2014.
Office Action for U.S. Appl. No. 12/069,827, dated Apr. 20, 2010.
Office Action for U.S. Appl. No. 12/069,827, dated Jan. 27, 2011.
Office Action for U.S. Appl. No. 12/069,827, dated Oct. 29, 2010.
Office Action for U.S. Appl. No. 12/152,766, dated Apr. 1, 2011.
Office Action for U.S. Appl. No. 12/152,766, dated Mar. 12, 2010.

(56) References Cited

OTHER PUBLICATIONS

Office Action for U.S. Appl. No. 12/152,766, dated Oct. 7, 2010.
Office Action for U.S. Appl. No. 12/154,691, dated Dec. 17, 2009.
Office Action for U.S. Appl. No. 12/291, 293, dated Mar. 1, 2011.
Office Action for U.S. Appl. No. 12/291,293, dated May 27, 2010.
Office Action for U.S. Appl. No. 12/635,818, dated Oct. 14, 2010.
Office Action for U.S. Appl. No. 12/695,978, dated Dec. 20, 2010.
Office Action for U.S. Appl. No. 12/695,978, dated May 10, 2011.
Office Action for U.S. Appl. No. 12/291,293, dated Sep. 3, 2010.
Office Action from U.S. Appl. No. 11/465,120, dated Dec. 9, 2011.
Office Action from U.S. Appl. No. 11/496,922 dated Feb. 9, 2012.
Office Action from U.S. Appl. No. 11/982,275 dated Apr. 30, 2014.
Office Action from U.S. Appl. No. 12/002,410, dated Dec. 21, 2011.
Office Action from U.S. Appl. No. 12/002,410, dated Mar. 28, 2012.
Office Action from U.S. Appl. No. 12/321,059 dated Feb. 10, 2012.
Office Action from U.S. Appl. No. 12/614,989 dated Mar. 12, 2012.
Office Action from U.S. Appl. No. 12/695,978 dated Mar. 14, 2012.
Office Action from U.S. Appl. No. 12/757,179 dated Jan. 19, 2012.
Office Action from Japanese Patent Application No. 2008/81533 dated Jul. 22, 2014.
Office Action from Japanese Patent Application No. 2012/288000 dated Oct. 8, 2013.
Office Action from U.S. Appl. No. 12/002,410, dated Jan. 29, 2013.
Office Action from U.S. Appl. No. 12/868,567 dated Feb. 22, 2013.
Office Action from U.S. Appl. No. 12/069,827 dated Aug. 9, 2012.
Office Action from U.S. Appl. No. 11/149,998 dated Apr. 3, 2013.
Office Action from U.S. Appl. No. 11/465,120 dated Aug. 21, 2012.
Office Action from U.S. Appl. No. 11/465,120 dated Jun. 19, 2012.
Office Action from U.S. Appl. No. 11/496,922 dated Jun. 26, 2013.
Office Action from U.S. Appl. No. 11/496,922 dated Nov. 23, 2012.
Office Action from U.S. Appl. No. 11/496,922 dated Oct. 9, 2013.
Office Action from U.S. Appl. No. 11/982,275 dated Jul. 9, 2012.
Office Action from U.S. Appl. No. 11/982,275 dated May 9, 2013.
Office Action from U.S. Appl. No. 11/982,275 dated Nov. 28, 2012.
Office Action from U.S. Appl. No. 11/982,275 dated Sep. 18, 2012.
Office Action from U.S. Appl. No. 12/002,410 dated Feb. 4, 2014.
Office Action from U.S. Appl. No. 12/002,410 dated May 20, 2014.
Office Action from U.S. Appl. No. 12/002,410 dated Sep. 10, 2013.
Office Action from U.S. Appl. No. 12/002,410 filed Dec. 18, 2012.
Office Action from U.S. Appl. No. 12/002,410 dated Sep. 25, 2012.
Office Action from U.S. Appl. No. 12/069,827 dated Apr. 1, 2014.
Office Action from U.S. Appl. No. 12/069,827 dated Dec. 6, 2012.
Office Action from U.S. Appl. No. 12/069,827 dated Jul. 11, 2014.
Office Action from U.S. Appl. No. 12/069,827 dated Oct. 25, 2013.
Office Action from U.S. Appl. No. 12/069,827 dated Mar. 5, 2013.
Office Action from U.S. Appl. No. 12/291,293, dated Feb. 28, 2013.
Office Action from U.S. Appl. No. 12/695,978 dated Jan. 31, 2014.
Office Action from U.S. Appl. No. 12/695,978 dated Sep. 17, 2013.
Office Action from U.S. Appl. No. 12/695,978, dated Apr. 18, 2013.
Office Action from U.S. Appl. No. 12/757,179 dated Jul. 16, 2012.
Office Action from U.S. Appl. No. 12/757,179 filed Dec. 31, 2012.
Office Action from U.S. Appl. No. 12/757,179 filed Sep. 25, 2012.
Office Action from U.S. Appl. No. 12/757,891 dated Jan. 14, 2014.
Office Action from U.S. Appl. No. 12/757,891 dated May 9, 2012.
Office Action from U.S. Appl. No. 12/757,891 dated Nov. 28, 2012.
Office Action from U.S. Appl. No. 12/757,891 dated Jun. 18, 2013.
Office Action from U.S. Appl. No. 12/868,567 dated Jul. 5, 2013.
Office Action from U.S. Appl. No. 12/868,567 dated Sep. 12, 2012.
Office Action from U.S. Appl. No. 12/875,873 dated Aug. 22, 2012.
Office Action from U.S. Appl. No. 12/875,873 dated Feb. 25, 2014.
Office Action from U.S. Appl. No. 12/875,873 dated Feb. 21, 2013.
Office Action from U.S. Appl. No. 12/875,873 dated Jul. 3, 2013.
Office Action from U.S. Appl. No. 12/875,873 dated Jun. 25, 2014.
Office Action from U.S. Appl. No. 12/875,873 dated Oct. 18, 2013.
Office Action from U.S. Appl. No. 13/306,589 dated Feb. 20, 2013.
Office Action from Russian Patent Application No. 2011146934/28 dated Feb. 28, 2014.
Official Communication from the EPO regarding related European Application 08253301.9. dated Nov. 17, 2009.
Official Notice of Decision for Refusal regarding related Japanese Design Application No. 2009-002857, dated Oct. 30, 2009.
Partial European Search Report from European Patent Application No. 0825319.6-1564 dated Apr. 29, 2014.
Reason for Rejection from Japanese Patent Application No. 2009/507195 dated Jul. 15, 2014.
Restriction Requirement for U.S. Appl. No. 11/465,120 dated Jun. 2, 2008.
Restriction Requirement for U.S. Appl. No. 11/496,922 dated May 19, 2008.
Restriction Requirement for U.S. Appl. No. 11/600,617 dated Feb. 14, 2008.
Restriction Requirement for U.S. Appl. No. 11/982,275 dated Feb. 23, 2010.
Restriction Requirement for U.S. Appl. No. 12/002,410 dated May 27, 2009.
Restriction Requirement for U.S. Appl. No. 12/154,691 dated Sep. 29, 2009.
Restriction Requirement for U.S. Appl. No. 29/293,900 dated Apr. 5, 2010.
Restriction Requirement for U.S. Appl. No. 13/306,589 dated Jan. 9, 2013.
Restriction Requirement for U.S. Appl. No. 13/652,241 dated Aug. 2, 2013.
Sakai et al., "Experimental Investigation of Dependence of Electrical Characteristics on Device Parameters in Trench Mos Barrier Shottky Diodes," Proceedings of 1998 International Symposium on Power Semiconductor Devices & ICs, Kyoto, pp. 293-296, Jun. 1998.
Search Report for European Patent Application No. 10731037.7 dated Dec. 11, 2013.
Search Report from Chinese Patent Application No. 201210046248.2 dated Apr. 15, 2014.
Second Office Action from Chinese Patent Appl. No. 201110039138.9. dated Jan. 31, 2013.
Second Office Action from Chinese Patent Application No. 201210046248.2 dated Apr. 15, 2014.
Supplemental European Search Report from European Patent Application No. 10731037.7 dated Jan. 9, 2014.
Second Office Action from People's Republic of China, re: China Application No. 200480027969.2, dated Jul. 4, 2008.
Third Office Action from Chinese Patent Application No. 200710152109.7, dated Mar. 5, 2013.
U.S. Appl. No. 11/685,761, filed Mar. 13, 2007.
Copending U.S. Appl. No. 11/443,741, filed Jun. 14, 2007.
(From related application) Canadian Patent Application No. 2,454,310, Office Action dated Feb. 9, 2010.
Appeal Decision in Japanese Design Patent Application No. 2009-002857 (Appeal No. 2010-002154) mailed Aug. 20, 2010.
Cree Xlamp MC-E Leds Product Info Sheets, pp. 1-3.
Declaration of Charles Swobada under 37 C.F.R.S 1.132, dated: Aug. 19, 2009.
Declaration of Gerald Negley under 37 C.F.R.S 1.132, dated: Aug. 20, 2009.
European Search Report from related European Application No. 07254498.4, dated Feb. 11, 2010.
European Search Report, dated Feb. 24, 2009, re related European Application No. EP 08253301.
Examiner's Report to the Board (Summary) from Japanese Patent Application No. 2003-529535, Appeal Filing No. 2009-007421 dated Dec. 7, 2010.
Final Office Action for U.S. Appl. No. 11/982,275 dated Jan. 13, 2011.
First Office Action for Chinese Patent Application No. 200780019643.9 dated Mar. 29, 2010.
International Preliminary Report on Patentability for Chinese PCT No. PCT/CN2010/070073 dated Apr. 28, 2011.
International Search Report and Written Opinion for PCT/CN2010/001865 dated Jun. 9, 2011.
International Search Report and Written Opinion from PCT/US2010/001852 dated Nov. 11, 2010.
International Search Report and Written Opinion in counterpart Application No. PCT/US2010/001255 dated Aug. 13, 2010.

(56) References Cited

OTHER PUBLICATIONS

International Search Report for PCT/CN2009/074800 dated Feb. 25, 2010.
International Search Report for PCT/US2008/004453 dated Sep. 9, 2008.
Invitation to Submit Applicant's Opinion (Summary) from Japanese Patent Application No. 2003-529535, Appeal Filing No. 2009-007421 dated Dec. 7, 2010.
JP 2001 060072A, Abstract, Matsushita Electric Ind. Co Ltd., Mar. 6, 2001.
Kim J.K et al. "Strongly Enhanced Phosphor Efficiency in GaInn White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Nichia Corp. White Led Part No. NSPW300BS, Specification for Nichia White Led, Model NSPW300BS., Jan. 14, 2004.
Nichia Corp., White Led Part No. NSPW312BS, Specification for Nichia White Led, Model NSPW312BS. Jan. 14, 2004.
Nichia Corporation Leds, Models NSSM016G, NSSM16G, NESM026X, NSSM026BB, NESM005A, 9 pages.
Non-Final Office Action for U.S. Appl. No. 11/982,275 dated Aug. 20, 2010.
Notice of First Office Action from related China Patent Application No. 200710422176, dated Jun. 22, 2009.
Notice of Reasons for Rejection for Japanese Patent Application No. 2007-211901 dated Apr. 14, 2011.
Notice Requesting Submission of Opinion re related Korean Application No. 10-2004-7001033 dated Mar. 9, 2009.
Notification of First Office Action in Chinese Patent Application No. 200880009255.7 dated Sep. 26, 2010.
Notification of First Office Action in Chinese Patent Application No. 200880100370.5 dated Apr. 26, 2011.
Office Action from U.S. Appl. No. 11/149,998, dated May 18, 2010.
Office Action from U.S. Appl. No. 11/149,998, dated Nov. 20, 2009.
Office Action from U.S. Appl. No. 11/465,120, dated Mar. 9, 2010.
Office Action from U.S. Appl. No. 12/069,827, dated Apr. 20, 2010.
Office Action from U.S. Appl. No. 12/152,766, dated Mar. 12, 2010.
Office Action from U.S. Appl. No. 12/154,691, dated Dec. 17, 2009.
Office Action from U.S. Appl. No. 12/321,059, dated May 17, 2010.
Office Action from related U.S. Appl. No. 11/600,617, dated Dec. 22, 2009.
Office Action from related China Application No. 200710142310.7, dated Dec. 11, 2009.
Office Action in related U.S. Appl. No. 11/149,998, dated Jan. 24, 2011.
Office Action in related U.S. Appl. No. 11/149,998, dated Aug. 27, 2010.
Office Action in related U.S. Appl. No. 11/149,998, dated Nov. 20, 2009.
Office Action in related U.S. Appl. No. 11/149,998, dated May 11, 2011.
Office Action in related U.S. Appl. No. 11/149,998, dated May 18, 2010.
Office Action in related U.S. Appl. No. 11/465,120, dated Dec. 13, 2010.
Office Action in related U.S. Appl. No. 11/465,120, dated Mar. 9, 2010.
Office Action in related U.S. Appl. No. 11/465,120, dated Sep. 8, 2010.
Office Action in related U.S. Appl. No. 11/496,922, dated Dec. 15, 2010.
Office Action in related U.S. Appl. No. 11/496,922, dated Jun. 10, 2010.
Office Action in related U.S. Appl. No. 12/002,410, dated Dec. 13, 2010.
Office Action in related U.S. Appl. No. 12/002,410, dated Apr. 26, 2011.
Office Action in related U.S. Appl. No. 12/002,410, dated May 25, 2010.
Office Action in related U.S. Appl. No. 12/069,827, dated Jan. 27, 2011.
Office Action in related U.S. Appl. No. 12/069,827, dated Oct. 29, 2010.
Office Action in related U.S. Appl. No. 12/069,827, dated Apr. 20, 2010.
Office Action in related U.S. Appl. No. 12/152,766, dated Oct. 7, 2010.
Office Action in related U.S. Appl. No. 12/152,766, dated Mar. 12, 2010.
Office Action in related U.S. Appl. No. 12/152,766, dated Apr. 1, 2011.
Office Action in related U.S. Appl. No. 12/154,691, dated Dec. 17, 2009.
Office Action in related U.S. Appl. No. 12/291,293, dated Mar. 1, 2011.
Office Action in related U.S. Appl. No. 12/291,293, dated Sep. 3, 2010.
Office Action in related U.S. Appl. No. 12/291,293, dated May 27, 2010.
Office Action in related U.S. Appl. No. 12/321,059, dated May 17, 2010.
Office Action in related U.S. Appl. No. 12/635,818, dated Oct. 14, 2010.
Office Action in related U.S. Appl. No. 12/695,978, dated Dec. 20, 2010.
Office Action in related U.S. Appl. No. 12/695,978, dated May 10, 2011.
Official Communication from the EPO regarding related European Application 08253301.9.
U.S. Appl. No. 11/473,089, filed Jun. 21, 2006, "Close Loop Electrophoretic Deposition of Semiconductor Devices".
U.S. Appl. No. 11/656,759, filed Nov. 22, 2007 and U.S. Appl. No. 11/899,790, filed Sep. 7, 2007, "Wafer Level Phosphor Coating Method and Devices Fabricated Utilizing Method".
PCT Search Report and Written Opinion PCT/US2007/086237, dated May 8, 2008 in related application.
PCT Search Report and Written Opinion PCT/US2007/086242, dated Mar. 4, 2008.
PCT Search Report and Written Opinion PCT/US2007/12403, dated Aug. 6, 2008.
Preliminary Notice of Reasons for Refusal re related Japanese Application No. 2009-002857, dated Apr. 24, 2009, pp. 1-2.
Preliminary Notice of Reasons for Refusal re related Japanese Application No. 2009-002857, dated Jul. 24, 2009.
Response to OA in related U.S. Appl. No. 12/154,691, dated Dec. 17, 2009, Response filed: May 17, 2010.
Response to Office Action from U.S. Appl. No. 11/149,998, dated Feb. 22, 2010.
Response to Office Action from U.S. Appl. No. 12/154,691, dated May 17, 2010.
Sakai et al., "Experimental Investigtion of Dependence of Electrical Characteristics on Device Parameters in Trench Mos Barrier Shottky Diodes," Proceedings of 1998 International Symposium on Power Semiconductor Devices & ICs, Kyoto, pp. 293-296, Jun. 1998.
Second Office Action from related Chinese Application No. 200710142217.6 dated Nov. 6, 2009.
The Second Office Action from People's Republic of China, re: China Application No. 200480027969.2, dated Jul. 4, 2008.
Copending U.S. Appl. No. 11/443,741, filed Mar. 13, 2007.
Copending U.S. Appl. No. 11/939,059, filed Nov. 13, 2007.
U.S. Appl. No. 11/982,275, filed Oct. 31, 2007 to Keller.
U.S. Appl. No. 12/024,400, filed Feb. 1, 2008 to Chakraborty.
Written Opinion for PCT/US2008/004453 dated Sep. 9, 2008.
Zhang AP et al, "Comparison of Gan P-I-N and Schottky Rectifier Performance" IEEE Transactions on Electron Devices, IEEE Inc. New York, US, vol. 48, No. 3, pp. 407-411, Mar. 2001.
Restriction Requirement for U.S. Appl. No. 29/250,973 dated May 14, 2008.
Extended European Search Report for European Patent Application No. 08253519.6 dated Aug. 13, 2014. (from parent U.S. Appl. No. 11/982,275).

(56) References Cited

OTHER PUBLICATIONS

Office Action from U.S. Appl. No. 12/875,873 dated Jun. 25, 2014. (from parent U.S. Appl. No. 11/982,275).
Response to Office Action from U.S. Appl. No. 12/875,873 filed Aug. 12, 2014. (from parent U.S. Appl. No. 11/982,275).
Office Action from U.S. Appl. No. 12/069,827 dated Jul. 11, 2014. (from parent U.S. Appl. No. 11/982,275).
Office Action from U.S. Appl. No. 12/695,978 dated Jul. 16, 2014. (from parent U.S. Appl. No. 11/982,275).
Response to Office Action from U.S. Appl. No. 12/695,978 filed Aug. 11, 2014. (from parent U.S. Appl. No. 11/982,275).
Decision on Appeal from Japanese Patent Application No. 2011-545616 dated Jun. 27, 2014.(from parent U.S. Appl. No. 11/982,275).
Reason for Rejection from Japanese Patent Application No. 2009/507195 dated Jul. 15, 2014.(from parent U.S. Appl. No. 11/982,275).
Notification of Allowance from Taiwanese Application No. 103202911 dated Jul. 16, 2014.(from parent U.S. Appl. No. 11/982,275).
Office Action and Search Report from Chinese Patent Application No. 2011200391389 dated Jun. 23, 2014. (from parent U.S. Appl. No. 11/982,275).
Office Action from Japanese Patent Application No. 2008/81533 dated Jul. 22, 2014. (from parent U.S. Appl. No. 11/982,275).
Search Report from Chinese Patent Application No. 201210046248.2 dated Apr. 15, 2014. (from parent U.S. Appl. No. 11/982,275).
International Preliminary Report on Patentability from PCT/US2012/065060 dated Jun. 12, 2014. (from parent U.S. Appl. No. 11/982,275).
Office Action from U.S. Appl. No. 12/002,410 dated May 20, 2014. (from parent U.S. Appl. No. 11/982,275).
Notification of Reexamination from Chinese Patent Application No. 200880092557 dated May 12, 2014. (from parent U.S. Appl. No. 11/982,275).
Examination from European Patent Application No. 09 824 413-1551 dated May 16, 2014. (from parent U.S. Appl. No. 11/982,275).
Decision on Rejection from Chinese Patent Application No. 2007101521097 dated Mar. 17, 2014. (from parent U.S. Appl. No. 11/982,275).
Decision of Rejection from Japanese Patent Application No. 2011/259253 dated Mar. 25, 2014. (from parent U.S. Appl. No. 11/982,275).
Partial European Search Report from European Patent Application No. 0825319.6-1564 dated Apr. 29, 2014.(from parent U.S. Appl. No. 11/982,275).
Office Action from Russian Patent Application No. 2011146934/28 dated Feb. 28, 2014.(from parent U.S. Appl. No. 11/982,275).
Second Office Action from Chinese Patent Application No. 201210046248.2 dated Apr. 15, 2014. (from parent U.S. Appl. No. 11/982,275).
Office Action from U.S. Appl. No. 12/875,873 dated Feb. 25, 2014. (from parent U.S. Appl. No. 11/982,275).
Office Action from U.S. Appl. No. 13/652,241 dated Mar. 12, 2014. (from parent U.S. Appl. No. 11/982,275).
Office Action from U.S. Appl. No. 12/069,827 (from parent U.S. Appl. No. 11/982,275).
Decision of Re-Examination from Chinese Patent Application No. 201110039138.9 dated Mar. 13, 2014. (from parent U.S. Appl. No. 11/982,275).
First Office Action from Chinese Patent Application No. 201080027586.0 dated Feb. 8, 2014. (from parent U.S. Appl. No. 11/982,275).
Interrogation from Japanese Patent Application No. 2008/281533 dated Jan. 21, 2014. (from parent U.S. Appl. No. 11/982,275).
Interrogation from Japanese Patent Application No. 2009/507195 dated Jan. 28, 2014. (from parent U.S. Appl. No. 11/982,275).
Notification of Designation of the Appeal Examiner from Japanese Patent Application No. 2009/507195 dated Jan. 22, 2014. (from parent U.S. Appl. No. 11/982,275).
International Search Report and Written Opinion from PCT/US2013/073921 dated Feb. 18, 2014. (from parent U.S. Appl. No. 11/982,275).
Decision of Registration from Japanese Design Application No. 2012/030304 dated Jan. 21, 2014. (from parent U.S. Appl. No. 11/982,275).
Office Action from U.S. Appl. No. 12/757,891 dated Jan. 14, 2014. (from parent U.S. Appl. No. 11/982,275).
Office Action from U.S. Appl. No. 12/695,978 dated Jan. 31, 2014. (from parent U.S. Appl. No. 11/982,275).
Office Action from U.S. Appl. No. 12/002,410 dated Feb. 4, 2014. (from parent U.S. Appl. No. 11/982,275).
Fifth Office Action from Chinese Patent Application No. 2007/10152109.7 dated Jan. 6, 2014. (from parent U.S. Appl. No. 11/982,275).
Supplemental European Search Report from European Patent Application No. 10731037.7 dated Jan. 9, 2014. (from parent U.S. Appl. No. 11/982,275).
Search Report for European Patent Application No. 10731037.7 dated Dec. 11, 2013. (from parent U.S. Appl. No. 11/982,275).
Notice of Reasons for Rejection from Japanese Patent Application No. 2011/534993 dated Nov. 12, 2013. (from parent U.S. Appl. No. 11/982,275).
Notice of Reasons for Rejection from Japanese Patent Application No. 2007/211901 dated Oct. 8, 2013. (from parent U.S. Appl. No. 11/982,275).
Notification of Loss of Rights from European Patent Application No. 09824413.0 dated Oct. 17, 2013. (from parent U.S. Appl. No. 11/982,275).
Appeal board's Questioning from Japanese Patent Application No. 2011/545616 dated Nov. 12, 2013. (from parent U.S. Appl. No. 11/982,275).
Office Action from U.S. Appl. No. 12/069,827 dated Oct. 25, 2013. (from parent U.S. Appl. No. 11/982,275).
Office Action from U.S. Appl. No. 11/496,922 dated Oct. 9, 2013. (from parent U.S. Appl. No. 11/982,275).
Office Action from U.S. Appl. No. 12/875,873 dated Oct. 18, 2013. (from parent U.S. Appl. No. 11/982,275).
Office Action from Japanese Patent Application No. 2012/288000 dated Oct. 8, 2013. (from parent U.S. Appl. No. 11/982,275).
Decision of Rejection from Chinese Patent Application No. 201110039138.9 dated Sep. 25, 2013. (from parent U.S. Appl. No. 11/982,275).
Office Action from U.S. Appl. No. 12/695,978 dated Sep. 17, 2013. (from parent U.S. Appl. No. 11/982,275).
Office Action from U.S. Appl. No. 13/652,241 dated Sep. 11, 2013. (from parent U.S. Appl. No. 11/982,275).
Office Action from U.S. Appl. No. 12/002,410 dated Sep. 10, 2013. (from parent U.S. Appl. No. 11/982,275).
Appeal Decision from Japanese Patent Application No. 2008/515699 dated Sep. 20, 2013. (from parent U.S. Appl. No. 11/982,275).
Decision of Rejection from Chinese Patent Application No. 201001067346.2 dated Aug. 30, 2013. (from parent U.S. Appl. No. 11/982,275).
Decision of Rejection from Chinese Patent Application No. 201080001658.4 dated Jun. 20, 2013. (from parent U.S. Appl. No. 11/982,275).
Non-Final Office Action for U.S. Appl. No. 11/982,275 dated Aug. 8, 2013.
Office Action from U.S. Appl. No. 12/868,567 dated Jul. 5, 2013. (from parent U.S. Appl. No. 11/982,275).
Office Action from U.S. Appl. No. 12/875,873 dated Jul. 3, 2013. (from parent U.S. Appl. No. 11/982,275).
Office Action from U.S. Appl. No. 11/496,922 dated Jun. 26, 2013.(from parent U.S. Appl. No. 11/982,275).
Office Action from U.S. Appl. No. 12/757,891 dated Jun. 18, 2013.(from parent U.S. Appl. No. 11/982,275).
Office Action from U.S. Appl. No. 12/069,827 dated Mar. 5, 2013. (from parent U.S. Appl. No. 11/982,275).
Response to OA from U.S. Appl. No. 12/069,627 filed Jun. 5, 2013.(from parent U.S. Appl. No. 11/982,275).
Office Action from U.S. Appl. No. 11/149,998 dated Apr. 3, 2013. (from parent U.S. Appl. No. 11/982,275).
Response to OA from U.S. Appl. No. 11/149,998 filed Jun. 25, 2013.(from parent U.S. Appl. No. 11/982,275).
Office Act ion from U.S. Appl. No. 12/868,567 dated Sep. 12, 2012.(from parent U.S. Appl. No. 11/982,275).
Response to OA from U.S. Appl. No. 12/666,567 filed Jan. 14, 2013.(from parent U.S. Appl. No. 11/982,275).

(56) References Cited

OTHER PUBLICATIONS

Office Action from Patent Application No. 12/002,410 dated Sep. 25, 2012.(from parent U.S. Appl. No. 11/982,275).
Response to OA from U.S. Appl. No. 12/002,410 dated Dec. 18, 2012. (from parent U.S. Appl. No. 11/982,275).
Office Action from U.S. Appl. No. 12/069,827 dated Aug. 9, 2012.(from parent U.S. Appl. No. 11/982,275).
Response to OA from U.S. Appl. No. 12/069,827 dated Nov. 9, 2012. (from parent U.S. Appl. No. 11/982,275).
Office Action from U.S. Appl. No. 11/465,120 dated Aug. 21, 2012.(from parent U.S. Appl. No. 11/982,275).
Response to DA from U.S. Appl. No. 11/465,120 dated Aug. 24, 2012.(from parent U.S. Appl. No. 11/982,275).
Office Action from U.S. Appl. No. 12/875,873 dated Aug. 22, 2012. (from parent U.S. Appl. No. 11/982,275).
Response to OA from U.S. Appl. No. 12/875,873 dated Nov. 19, 2012.(from parent U.S. Appl. No. 11/982,275).
Office Action from U.S. Appl. No. 11/465,120 dated Jun. 19, 2012.(from parent U.S. Appl. No. 11/982,275).
Response to OA from U.S. Appl. No. 11/465,120, dated Aug. 15, 2012.(from parent U.S. Appl. No. 11/982,275).
Office Action from U.S. Appl. No. 12/757,179 filed Sep. 25, 2012.(from parent U.S. Appl. No. 11/982,275).
Response to OA from U.S. Appl. No. 12/757,179 filed Sep. 25, 2012.(from parent U.S. Appl. No. 11/982,275).
Office Action from U.S. Appl. No. 12/069,827 dated Dec. 6, 2012. (from parent U.S. Appl. No. 11/982,275).
Response to OA from U.S. Appl. No. 12/069,827. filed Jan. 29, 2013.(from parent U.S. Appl. No. 11/982,275).
Office Action from U.S. Appl. No. 11/496,922 dated Nov. 23, 2012.(from parent U.S. Appl. No. 11/982,275).
Response to OA from U.S. Appl. No. 11/496,922, filed Apr. 23, 2012.(from parent U.S. Appl. No. 11/982,275).
Office Action from U.S. Appl. No. 12/757,891 dated Nov. 28, 2012.(from parent U.S. Appl. No. 11/982,275).
Response to OA from U.S. Appl. No. 12/757,891 filed Jan. 28, 2013.(from parent U.S. Appl. No. 11/982,275).
Office Action from U.S. Appl. No. 13/306,589, dated Feb. 20, 2013.(from parent U.S. Appl. No. 11/982,275).
Response to OA from U.S. Appl. No. 13/306,589, filed May 16, 2013.(from parent U.S. Appl. No. 11/982,275).
Office Action from U.S. Appl. No. 12/002,410, dated Jan. 29, 2013.(from parent U.S. Appl. No. 11/982,275).
Response to OA from U.S. Appl. No. 12/002,410. filed Apr. 18, 2013.(from parent U.S. Appl. No. 11/982,275).
Office Action from U.S. Appl. No. 12/868,567 dated Feb. 22, 2013.(from parent U.S. Appl. No. 11/982,275).
Response to OA from U.S. Appl. No. 12/868,567, filed May 21, 2013,(from parent U.S. Appl. No. 11/982,275).
Office Action from U.S. Appl. No. 12/875,873, dated Feb. 21, 2013.(from parent U.S. Appl. No. 11/982,275).
Response to OA from U.S. Appl. No. 12/875,873 filed Apr. 19, 2013.(from parent U.S. Appl. No. 11/982,275).
Office Act ion from U.S. Appl. No. 12/291,293, dated Feb. 28, 2013.(from parent U.S. Appl. No. 11/982,275).
Response to OA from U.S. Appl. No. 12/291,293 filed Jun. 5, 2013.(from parent U.S. Appl. No. 11/982,275).
Office Action from U.S. Appl. No. 12/695,978, dated Apr. 18, 2013.(from parent U.S. Appl. No. 11/982,275).
Response to OA from U.S. Appl. No. 12/695,978. filed Jul. 10, 2013. (from parent U.S. Appl. No. 11/982,275).
Notice of Reasons for Rejection from Japanese Patent Appl. No. 2011 259253, dated May 28, 2013. (from parent U.S. Appl. No. 11/982,275).
Decision of ReJection from Japanese Patent Appl. No. 2008-281533, dated May 28, 2013.(from parent U.S. Appl. No. 11/982,275).
Decision of ReJection from Japanese Patent Application No. 2009 50719 5, dated May 21, 2013.(from parent U.S. Appl. No. 11/982,275).
Notice of Reasons for Rejection from Japanese Patent A.pplication No. 2007-211901, dated Apr. 9, 2013.(from parent U.S. Appl. No. 11/982,275).
Decision of Rejection from Japanese Patent Application No. 2011-545616 dated Apr. 26, 2013.(from parent U.S. Appl. No. 11/982,275).
Third Office Action from Chinese Patent Application No. 200710152109.7, dated: Mar. 5, 2013(from parent U.S. Appl. No. 11/982,275).
Interrogation from Japanese Patent Application No. 2008 515699, dated Feb. 19, 2013(from parent U.S. Appl. No. 11/982,275).
Communication from European Patent Appl No. 09824413 .0-1551, dated Feb. 28, 2013(from parent U.S. Appl. No. 11/982,275).
European Search Report from European Patent Appl. No. 09824413. 0-1551, dated Feb. 11, 2013(from parent U.S. Appl. No. 11/982,275).
Notice of Reasons for Rejection from Japanese Patent Appl No. 2011-534993, dated Mar. 12, 2013(from parent U.S. Appl. No. 11/982,275).
Notification of the Second Office Action from Chinese Patent Application No. 201010167346.2 dated Feb. 17, 2013(from parent U.S. Appl. No. 11/982,275).
First Office Action from Chinese Patent Application No. 201080001658.4 dated Sep. 24, 2012. (from parent U.S. Appl. No. 11/982,275).
Extended Search Report for European Patent Application No. 09824413.0-1551, dated Feb. 11, 2013(from parent U.S. Appl. No. 11/982,275).
Second Office Action from Chinese Patent Appl. No. 201110039138. 9, dated Jan. 31, 2013(from parent U.S. Appl. No. 11/982,275).
International Search Report and Written Opinion from PCT application No. PCT/US2012/065060, dated Feb. 20, 2013.(from parent U.S. Appl. No. 11/982,275).
Nichia Corporation LEDs, Specification for NSSM227AT, 15 pages (from parent U.S. Appl. No. 12/757,891).
Nichia Corporation LEDs, Specification for NESM06CT, 15 pages (from parent U.S. Appl. No. 12/757,891).
Nichia Corporation LEDs, Specification for NSSM026BBT, 15 pages (from parent U.S. Appl. No. 12/757,891).
U.S. Appl. No. 11/685,761, filed Mar. 13, 2007. (from parent U.S. Appl. No. 12/757,891).
U.S. Appl. No. 11/939,047, filed Nov. 13, 2007.(from parent U.S. Appl. No. 12/757,891).
Interrogation from Japanese Patent Application No. 2007-211901 dated Aug. 21, 2012. (from parent U.S. Appl. No. 11/982,275).
Examination Report from European Patent Application No. 07789665.2 dated Aug. 20, 2012. (from parent U.S. Appl. No. 11/982,275).
Decision of Rejection from Chinese Patent Application No. 200880009255.7dated Sep. 5, 2012.(from parent U.S. Appl. No. 11/982,275).
First Office Action for Chinese Patent Application No. 201110039138.9 dated Jun. 4, 2012. (from parent U.S. Appl. No. 11/982,275).
Decision of Rejection from Japanese Patent Application No. 2008-515699 dated Jul. 17, 2012. (from parent U.S. Appl. No. 11/982,275).
Office Action from U.S. Appl. No. 12/757,891 dated May 9, 2012.(from parent U.S. Appl. No. 11/982,275).
Ofilce Actton from U.S. Appl. No. 11/465,120, dated Dec. 9, 2011..(from parent U.S. Appl. No. 11/982,275).
Office Action from U.S. Appl. No. 12/002,410, dated Mar. 28, 2012..(from parent U.S. Appl. No. 11/982,275).
Office Action from U.S. Appl. No. 12/002,410, dated Dec. 21, 2011..(from parent U.S. Appl. No. 11/982,275).
Response to Office Action tor U.S. Appl. No. 12/002,410, filed Mar. 8, 2012..(from parent U.S. Appl. No. 11/982,275).
Office Action from U.S. Appl. No. 12/757,179 dated Jan. 19, 2012..(from parent U.S. Appl. No. 11/982,275).
Office Action from U.S. Appl. No. 11/496,922 dated Feb. 9, 2012..(from parent U.S. Appl. No. 11/982,275).
Response to Office Action for U.S. Appl. No. 11/496,922 filed Apr. 6, 2012..(from parent U.S. Appl. No. 11/982,275).
Advisory Action for U.S. Appl. No. 11/496,922 dated Apr. 18, 2012..(from parent U.S. Appl. No. 11/982,275).
Office Action from U.S. Appl. No. 12/321,059 dated Feb. 10, 2012..(from parent U.S. Appl. No. 11/982,275).

(56) References Cited

OTHER PUBLICATIONS

Response to Office Action for U.S. Appl. No. 12/321,059 filed Apr. 9, 2012..(from parent U.S. Appl. No. 11/982,275).
Advisory Action from U.S. Appl. No. 12/321,059 dated Apr. 20, 2012..(from parent U.S. Appl. No. 11/982,275).
Office Action from U.S. Appl. No. 12/695,978 dated Mar. 14, 2012..(from parent U.S. Appl. No. 11/982,275).
Office Action from U.S. Appl. No. 12/614,989 dated Mar. 12, 2012..(from parent U.S. Appl. No. 11/982,275).
Office Action from U.S. Appl. No. 12/069,827 dated Apr. 3, 2012..(from parent U.S. Appl. No. 11/982,275).

\* cited by examiner

LIGHT EMITTING DIE (LED) PACKAGES AND RELATED METHODS

CROSS REFERENCE TO RELATED APPLICATIONS

This application relates, claims priority to and is a continuation-in-part application from these related matters: U.S. utility patent application Ser. No. 11/982,275, filed Oct. 31, 2007 now U.S. Pat. No. 9,070,850; and U.S. utility patent application Ser. No. 12/757,891, filed Apr. 9, 2010 now U.S. Pat. No. 8,866,169. The entire contents of all of the above matters are hereby incorporated by reference herein.

TECHNICAL FIELD

The subject matter disclosed herein relates generally to light emitting die packages and, more particularly, to light emitting die packages with improved performance characteristics and with at least one light emitting die operable for emitting red light or light close in wavelength to red or red-orange light.

BACKGROUND

Light emitting dies (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. As the bias or voltage is applied to the semiconductor, the energy that is used by the LED is converted into light energy, and the light is emitted from the active layer and from all surfaces of the LED. In order to use an LED chip in a circuit or other like arrangement, it is known to enclose an LED chip in a package to provide environmental and/or mechanical protection, color selection, focusing and the like. An LED package can also include electrical leads, contacts or traces for electrically connecting the LED package to an external circuit. In a typical LED package, an LED chip can be mounted on a reflective cup by means of a solder bond or conductive epoxy. One or more wire bonds can connect the ohmic contacts of the LED chip to leads, which may be attached to or integral with the reflective cup. The reflective cup may be filled with an encapsulant material containing a wavelength conversion material such as a phosphor. Light emitted by the LED at a first wavelength may be absorbed by the phosphor, which may responsively emit light at a second wavelength. The entire assembly can then be encapsulated in a clear protective resin, which may be molded in the shape of a lens to collimate the light emitted from the LED chip. While the reflective cup may direct light in an upward direction, optical losses may occur when the light is reflected (i.e. some light may be absorbed by the reflector cup instead of being reflected). In addition, heat retention may be an issue for such a package, since it may be difficult to extract heat through the leads.

A conventional LED package may be more suited for high power operations in one or more LED chips are mounted onto a carrier such as a printed circuit board (PCB) carrier, substrate or submount. Such a package can also generate more heat. A metal reflector mounted on the submount can surround the LED chip(s) and can reflect light emitted by the LED chips away from the package. The reflector can also provide mechanical protection to the LED chips. One or more wirebond connections can be made between ohmic contacts on the LED chips and electrical traces on the carrier. The mounted LED chips can then be covered with an encapsulant, which may provide environmental and mechanical protection to the chips while also acting as a lens. The metal reflector is typically attached to the carrier by means of a solder or epoxy bond.

While such a package may have certain advantages for high power operation, there may be a number of potential problems associated with using a separate metal piece as a metal reflector. For example, small metal parts may be difficult to manufacture repeatable with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

For higher powered operation, it may also be difficult to dissipate heat generated by the LED chip. This can be true for packages employing LEDs of specific light ranges, for example, LEDs that emit red and/or red-orange light. Submounts can be made of materials such as ceramics that are robust but do not efficiently conduct or dissipate heat which can result in reduced efficiency and output of the LED package as well as reduced lifetime or failure of the package. Other factors involved in using conventional packages can also reduce and/or limit the lumen performance, efficiency and/or lifetime of such LED packages.

SUMMARY

In accordance with this disclosure, novel LED packages and related methods are provided. In particular, LED packages and related methods are provided with at least one LED operable for emitting a dominant wavelength of, for example, generally between approximately 600 nm and approximately 650 nm, and more particularly between approximately 610 nm and approximately 630 nm. It is, therefore, an object of the disclosure herein to provide novel packages for LEDs and methods as described for example in further detail herein.

These and other objects as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
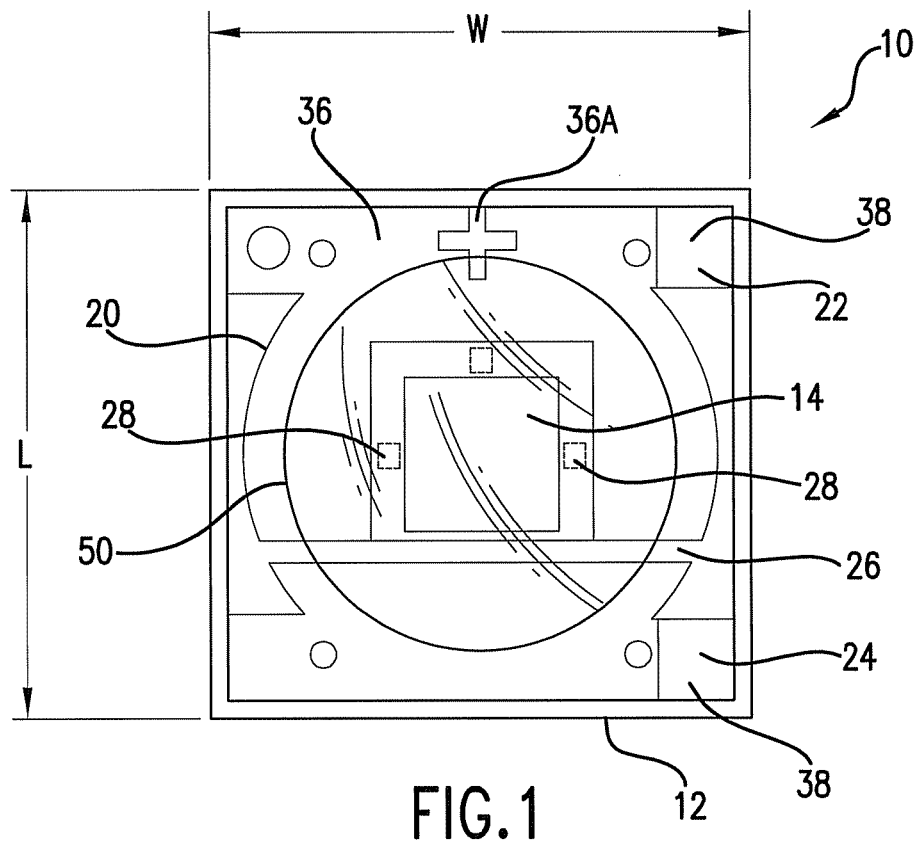
FIG. 1 is a top plan view illustrating an embodiment of a light emitting diode (LED) package according to the subject matter disclosed herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the subject matter disclosed herein are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion may be described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left" of the other structures or portions. It is understood that these terms are intended to encompass different orientations of the device in addition to the orientation depicted in the figures. Like numbers refer to like elements throughout.

Light emitting devices according to package embodiments described herein can comprise light emitting devices that emit a red or red-orange light, for example, light having a dominant wavelength generally between approximately 600 nm and approximately 650 nm, and, for example and without limitation, more specifically between approximately 610 nm and approximately 630 nm. Light emitting devices according to embodiments described herein may also comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. Nos. Re. 34,861; 4,946,547; and 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported, for example, in commonly assigned U.S. Pat. Nos. 5,210,051, 5,393,993, and 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

Solid state light LEDs may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials may be disposed in such encapsulants.

One or more of the LEDs can be coated, at least partially, with one or more phosphors with the phosphors absorbing at least a portion of the LED light and emitting a different wavelength of light such that the LED emits a combination of light from the LED and the phosphor. In one embodiment, such an LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

The disclosure herein is directed to compact, simple and efficient LED packages. Different embodiments can comprise one or more high power LEDs that typically operate at elevated temperatures. Packages according to the disclosure herein can include features to provide for improved thermal management, increased efficiency, greater luminance performance and longer life for the LED and LED package. The packages according to the disclosure herein can also comprise a lens molded directly over the one or more LEDs to protect the LED while still allowing for efficient emission characteristics.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure herein.

Embodiments of the subject matter of the disclosure are described herein with reference to schematic illustrations of idealized embodiments. As such, variations from the shapes of the illustrations as a result, for example, of manufacturing techniques and/or tolerances are expected. Embodiments of the subject matter disclosed herein should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the subject matter disclosed herein.

The subject matter of disclosure herein can be used in and/or with many different solid state emitters with the embodiments below being described in relation to LEDs, and in particular to red emitting LEDs and LED packages. It is understood that the disclosure herein can also use other solid state emitter packages beyond the embodiment shown. The disclosure herein can also be used with multiple emitter packages, such as LED packages having more than one LED. As stated above, other LEDs, such as white emitting LEDs, can be used with the red emitting LEDs for use in general lighting applications. The disclosure herein can also be used in any application wherein a conversion material is used to down-convert the wavelength of light from an emitter, and the discussion of the disclosure herein with reference to the following embodiment should not be construed as limiting to that particular embodiment or similar embodiments.

FIGS. 1 through 6 show one embodiment of a package for an LED generally designated 10 according to the disclosure herein generally comprising a substrate/submount ("submount") 12 with one or more LEDs 14 emitting the same or different colors. In the embodiment shown, a single LED or multiple LEDs can be mounted on submount 12. Submount 12 can comprise a ceramic submount. In the embodiment shown, LED 14 as shown herein can represent a single LED or multiple LEDs and at least one of the LEDs can emit red or red-orange light. For example, at least one of the LEDs can generate or emit a dominate wavelength of generally between approximately 600 nm and approximately 650 nm, or more particularly between approximately 610 nm and approximately 630 nm. The LEDs can have many different semiconductor layers arranged in different ways.

LED 14 can comprise a conductive current spreading structure (not shown) and can be mounted on wire bond pads on its top surface, both of which can be made of a conductive material and can be deposited using known methods. Some materials that can, for example, be used for these elements include Au, Cu, Ni, In, Al, Ag or combinations thereof and conducting oxides and transparent conducting oxides. The current spreading structure can generally comprise conductive fingers (not shown) arranged in a grid on LED 14 with the fingers spaced to enhance current spreading from wire bond pads into the LED's top surface. In operation, an electrical signal is applied to LEDs 14, such as through a wire bond as described below, and the electrical signal spreads through the fingers of the current spreading structure and the top surface into LED 14. Current spreading structures are often used in LEDs where the top surface is a p-type material, but they can also be used for n-type materials.

One or more of LEDs represented by LED 14 can be coated with one or more phosphors with the phosphors absorbing at least some of the LED light and emitting a different wavelength of light such that the LED emits a combination of light from LED 14 and the phosphor. At least one of the LEDs can be configured to emit red or red-orange light. In some embodiments, an LED can be constructed to emit a white light combination of LED and phosphor light. Alternatively, the LEDs can be coated using other methods such an electrophoretic deposition (EPD). It is understood that LED packages according to the disclosure herein can also have multiple LEDs of different colors, such as white emitting LEDs in additional to one or more red and/or red-orange emitting LEDs. Submount 12 can have a top surface 16 and a bottom surface 18 and can be formed of many different materials. Materials for submount 12 can be electrically insulating. Suitable materials can comprise, but are not limited to, ceramic materials such as aluminum oxide, aluminum nitride or organic insulators like polyimide (PI) and polyphthalamide (PPA). In some embodiments, submount 12 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

As stated above, submount 12 can comprise a ceramic submount. In some embodiments, submount 12 can comprise aluminum nitride (AlN). In package embodiments that use AlN as a material for submount 12 to which one or more red or red-orange LEDs are attached and the polarity is reversed such that the N-cladding is below the multi-quantum well and the P-cladding is above the multi-quantum well, the minimum luminous flux at a current of approximately 350 mA can be higher than in conventional packages the include red or red-orange LEDs.

For an LED 14 in package 10 that can emit light having a dominant wavelength of, for example, approximately 600 nm to approximately 650 nm, and more particularly approximately 610 nm to approximately 630 nm, luminance performance can be such that the minimum luminous flux can be approximately 90 lumens (lm) or greater. LED 14 when attached to package 10 in some embodiments can emit light having a dominant wavelength of approximately 610 nm to approximately 630 nm and a luminance performance such that the luminous flux can be approximately 100 lm or greater. In some embodiments, for example, LED 14 when attached to package 10 can emit light having a dominant wavelength of approximately 610 nm to approximately 630 nm and a luminance performance such that the luminous flux can be approximately 95 lm or greater. Packages 10 that use other substrate materials in submount 12 other than AlN and do not have the polarity reversed may also facilitate an LED that has a dominant wavelength of, for example, approximately 610 to approximately 630 nm to achieve a luminance performance of a luminous flux of approximately 90 lm or greater. While the minimum luminous flux produced above is with a current of approximately 350 mA, it is understood that a higher drive current can yield a higher luminous flux.

Using AlN as a substrate material for submount 12 in accordance with the disclosure herein can give improved thermal performance. In turn, improved thermal performance can give better reliability as well as less shift of the wavelength and less of a drop in lumens with increasing temperature. Using AlN as a substrate material for submount 12 can allow package 10 and any system in which it is used to run at a higher heat sink (submount) temperature for the same performance or at the same heat sink (submount) temperature for the same or greater performance. LEDS that are driven at higher temperatures and are able to thermally accommodate the higher temperatures can lead to a brighter output from LED 14 and package 10, since LEDs 14 can be driven harder or cheaper since a corresponding submount 12 can be easier to build. Running at higher current can lead to brighter output.

In manufacturing LEDs, the LEDs are formed on a larger semiconductor sheet or wafer. Some of these newly manufactured LEDs will not work as well as the majority of the other LEDs. These newly manufactured LEDs can be passed through a screening process that can quickly identify and/or predict which LED 14 will have the best reliability and should be selected for inclusion in a package 10.

As noted, many materials can be used to fabricate the submount element. In various embodiments, it is desirable to have a submount that is a good electrical insulator with low thermal resistance or high thermal conductivity (e.g., aluminum nitride). Some materials that may be used have a thermal conductivity of approximately 30 W/mK or higher, such as zinc oxide (ZnO). Other acceptable materials have thermal conductivities of approximately 120 W/mK or higher, such as aluminum nitride (AlN) which has a thermal conductivity that can range from approximately 140 W/mK to approximately 180 W/mK. In terms of thermal resistance, some acceptable materials have a thermal resistance of approximately 2° C./W or lower. Thus, package 10, for example, through the selection of the materials for the submount, can have a reduced thermal resistance. Other materials may also be used that have thermal characteristics outside the ranges discussed herein.

Top surface 16 of submount 12 can comprise patterned conductive features such as top electrically conductive elements that can comprise a die attach pad 20 with an integral first contact pad 22. A second contact pad 24 that is also considered a top electrically conductive element can also be included on top surface 16 with LED 14 mounted approximately at a center of attach pad 20. These electrically conductive elements can provide conductive paths for electrical connection to LED 14 using known contacting methods. LED 14 can be mounted to attach pad 20 using known mounting methods and material such as using conventional solder materials that may or may not contain a flux material or dispensed polymeric materials that may be thermally and electrically conductive. As noted above, LED 14 can be attached to attach pad 20 with the polarity of LED 14 reversed such that the N-cladding of LED 14 is below the multi-quantum well and the P-cladding of LED 14 is above the multi-quantum well.

In some embodiments, LED 14 can be mounted on attach pad 20 with a gold-tin (Au/Sn) solder. The Au/Sn solder can be deposited on LED 14. For example, the Au/Sn solder can be deposited on a bottom surface 14A of LED 14 and can reside between LED 14 and attach pad 20. Alternatively, The Au/Sn solder can be deposited on attach pad 20. For example, the Au/Sn solder can be deposited on attach pad 20 and can reside between LED 14 and attach pad 20.

A robust die attach process can help to achieve low electrical resistance, low thermal resistance and good mechanical and electrical integrity. A "flux-eutectic" die attach method can be used in attaching LEDs 14 to attach pad 20 with an Au/Sn solder. In such an attach method, no external force needs to be applied throughout the process. Such a die attach method can help prevent squeeze-out of the die attach metal during attachment, thereby reducing the risk of forming a Schottky contact in the package 10, for example with an n-substrate. During chip fabrication, an 80% Au/20% Sn eutectic metal layer can be deposited on bottom surface 14A of LED 14. The melting temperature of the 80% Au/20% Sn metal can be, for example, about 282° C. During assembly, a very small volume of flux can be placed on attach pad 20 by pin transfer or other precision dispense method, and LED 14 can be placed into the flux. For example, a no-clean flux (such as Alpha Metals UP78) can be dispensed onto attach pad 20 via pin transfer with a dot size of approximately 200 um. After die placement, attach pad 20 can be heated to a predetermined temperature for a set amount of time. For example, attach pad 20 can be heated to about 305° C. for about 5-8 seconds with direct heating method or hot air guns to reflow the Au/Sn metal. Subsequent cleaning in isopropyl alcohol in an ultrasonic bath can remove flux residue prior to wirebonding and encapsulation. For example, about a 15-minute ultrasonic isopropyl alcohol clean bath can be used.

When using such a die attach process, careful control of flux dispense volume can help to minimize risk of LED 14 movement during reflow. In addition, LED 14 can be placed through the flux and in contact with attach pad 20 prior to reflow. The peak temperature can be about 20° C. to about 30° C. above the melting temperature of the solder that is used. An RMA flux can result in good shear strengths; however, using too much flux can cause poor melting of the Au/Sn. The type of flux, the amount of flux used, and the reflow time and temperatures can be factors that should be understood and controlled by the user to optimize die attach results and long term reliability of the package 10.

Attach pad 20 and first and second contact pads 22, 24 can comprise different materials. Attach pad 20 and first and second contact pads 22, 24 can comprise, for example, metals or other conductive materials. In some embodiments, pads 20, 22, 24 comprise copper deposited using known techniques such as plating. In a typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments, the layer can be sputtered using a mask to form the desired pattern.

In some embodiments according to the disclosure herein some of the conductive elements can include only copper, with others of the elements including additional materials. For example, attach pad 20 can be plated or coated with additional metals or materials to make attach pad 20 more suitable for mounting one or more LEDs 14. For example, attach pad 20 can be plated with adhesive or bonding materials, or reflective and barrier layers.

Figure 4:
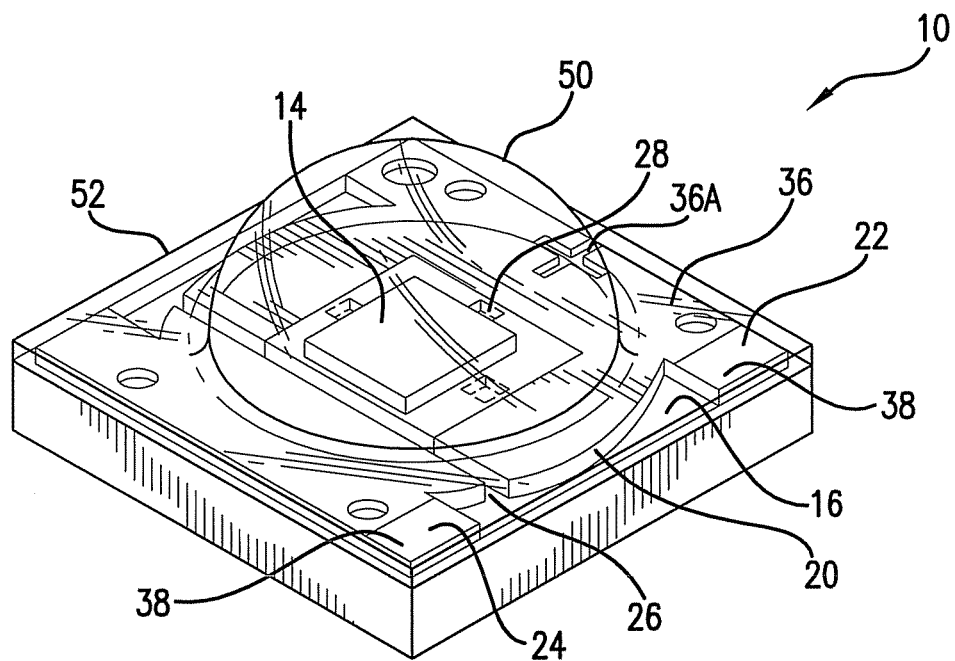
FIG. 4 is a top perspective view illustrating the embodiment of the LED package according to FIG. 1.
Figure 6:
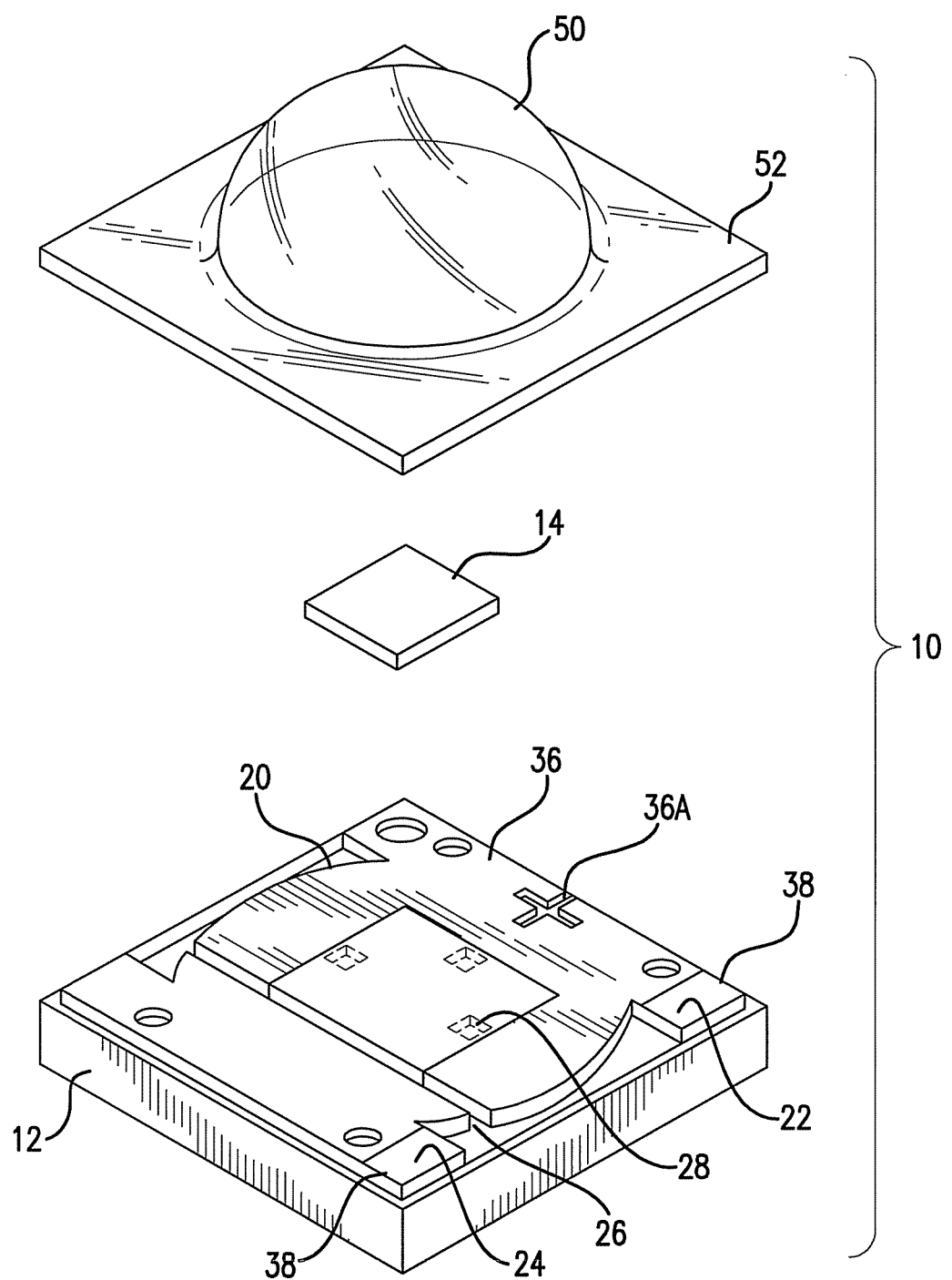
FIG. 6 is an exploded perspective view illustrating the embodiment of the LED package according to FIG. 1.

A gap 26 as seen in FIGS. 1, 4, and 6 can be included between second pad 24 and attach pad 20 down to the surface of submount 12. Gap 26 can provide electrical isolation between attach pad 20 and second pad 24. An electrical signal can be applied to LED 14 through second pad 24 and first pad 22, with the electrical signal on first pad 22 passing directly to LED 14 through attach pad 20 and the signal from second pad 24 passing into LED 14 through wire bonds or other conductive elements (not shown). Gap 26 can also provide electrical isolation between second pad 24 and attach pad 20 to prevent shorting of the signal applied to LED 14.

Figure 3:
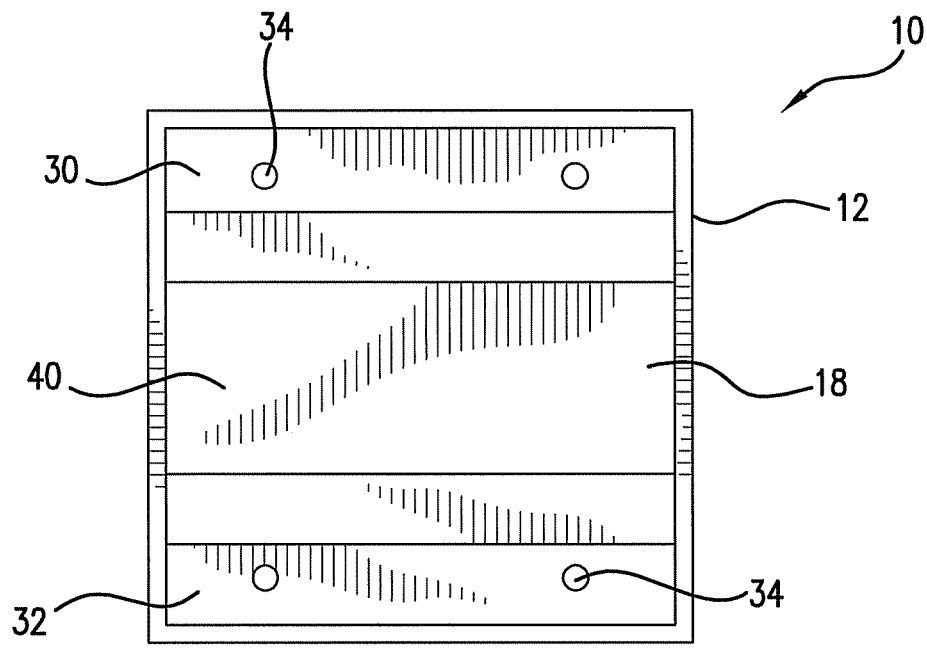
FIG. 3 is a bottom plan view illustrating the embodiment of the LED package according to FIG. 1.
Figure 5:
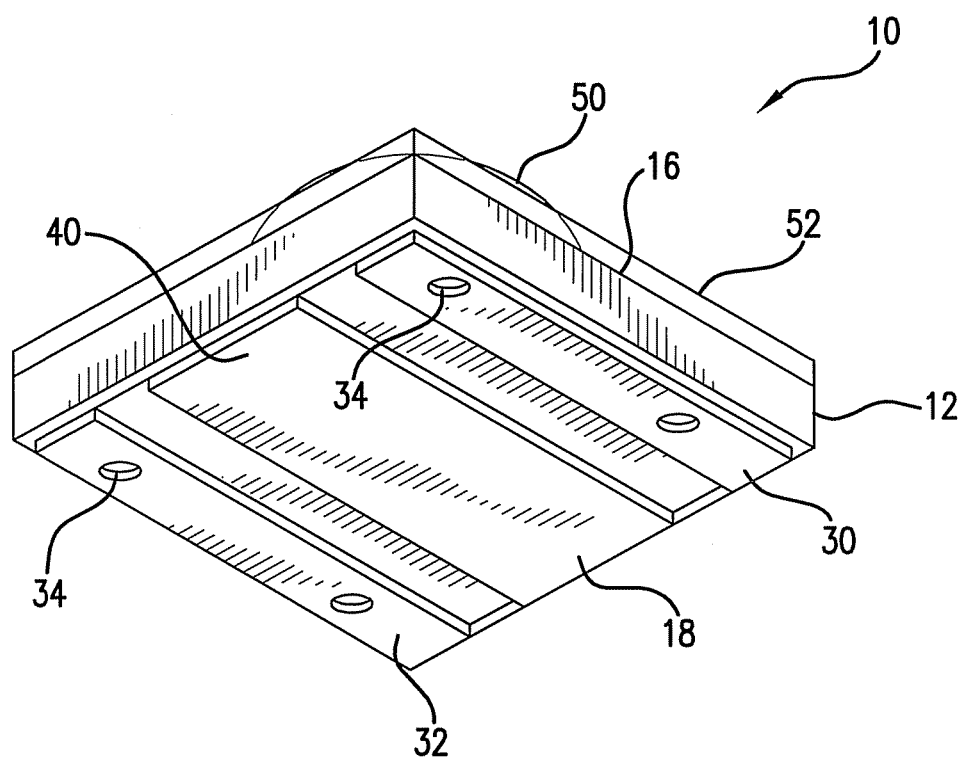
FIG. 5 is a bottom perspective view illustrating the embodiment of the LED package according to FIG. 1.

In some embodiments, an electrical signal can be applied to package 10 by providing external electrical contact to first and second bond pads 22, 24 such as by solder contacts or other conductive paths to a PCB. In the embodiment shown, LED package 10 can be arranged for mounting using surface mount technology and having internal conductive paths. LED package 10 can comprise first and second surface mount pads 30, 32, respectively, as seen in FIGS. 3 and 5 that can be formed on back surface 18 of submount 12. First and second surface mount pads 30, 32 can be at least partially in alignment with first and second contact pads 22, 24, respectively. Conductive vias 34 can be formed through submount 12 between first mounting pad 30 and first contact pad 22, such that, when a signal is applied to first mounting pad 30, the signal is conducted to first contact pad 22. Similarly, conductive vias 34 can be formed between second mounting pad 32 and second contact pad 24 to conduct an electrical signal therebetween as well. First and second mounting pads 30, 32 allow for surface mounting of LED package 10. In such embodiments, the electrical signal can be applied to LED 14 across first and second mounting pads 30, 32. Vias 34 and mounting pads 30, 32 can be made of many different materials using different techniques, including deposition methods that can be used for attach and contact pads 20, 22, 24.

It is understood that mounting pads 30, 32 and vias 34 can be arranged in many different ways and can have many different shapes and sizes. It is also understood that instead of vias, one or more conductive traces can be provided on the surface of the submount between the mounting pads and contact pads, such as along a side surface of submount 12.

Figure 2:
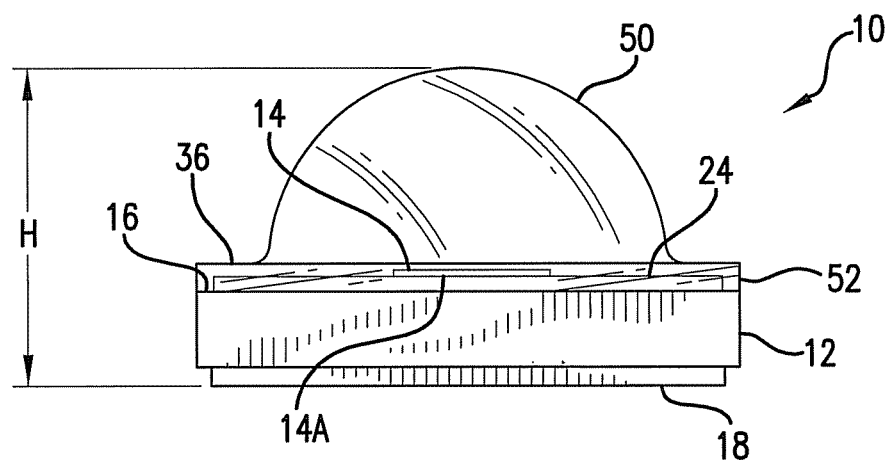
FIG. 2 is a side view illustrating the embodiment of the LED package according to FIG. 1.

A solder mask 36, as shown for example in FIGS. 1, 2 and 4, made of conventional materials can be included on top surface 16 of submount 12, at least partially covering attach pad 20 and first and second contact pads 22, 24, and at least partially covering gap 26. Solder mask 36 can protect these features during subsequent processing steps, which can include the mounting of LED 14 to attach pad 20 and wire bonding of LED 14 to package 10. During such steps, there can be a danger of solder or other materials depositing in undesired areas, which can result in damage to the areas or result in electrical shorting. Solder mask 36 can serve as an insulating and protective material that can reduce or prevent these dangers. Solder mask 36 can comprise an opening for mounting LED 14 to attach pad 20 and for attaching wire bonds (not shown) to second contact pad 24. Solder mask 36 can also comprise side openings 38 to allow convenient electrical access to contact pads 22, 24 for testing package 10 during fabrication. Solder mask 36 and/or attach pad 20 can also have alignment holes that provide for alignment during fabrication of package 10 and can also allow for alignment when mounted in place by an end user.

In some embodiments, solder mask 36 and/or attach pad 20 can be provided with a symbol or indicator 36A to illustrate which side of LED package 10 should be coupled to a positive or negative signal that can be applied to package 10. Symbol 36A can ensure accurate mounting of LED package 10 to a PCB or other fixture, whether by machine or hand. As in the embodiment shown, symbol 36A can comprise a plus (+) sign over first contact pad 22, indicating that package 10 should be mounted with the positive of the signal coupled to first mounting pad 30. The negative of the signal can then be coupled to second mounting pad 32. It is understood that many different symbol types can be used and that a symbol can also be included over second conductive pad 24 in addition or in the alternative to symbol 36A. It is also understood that the symbols can be placed in other locations other than solder mask 36.

Package 10 can also comprise elements to protect against damage from electrostatic discharge (ESD). Different elements can be used which can be on-chip. Examples of different elements can include, but are not limited to, various vertical silicon (Si) Zener diodes, different LEDs arranged in parallel and reverse biased to LED 14, surface mount varistors and/or lateral Si diodes. It is noted that solder mask 36 can include an opening for an ESD diode (not shown) if such a diode is desired, so that it can be mounted to attach pad 20. An arrangement with an LED 14 and the ESD diode can allow excessive voltage and/or current passing through the LED package 10 from an ESD event to pass through the ESD diode instead of LED 14, protecting LED 14 from damage. Different mounting materials and methods can be used such as those used to mount LED 14 to attach pad 20. One or more wire bonds (not shown) can also be included between the solder mask opening in the second contact pad 24 and LED 14. Wire bonds (not shown) for both LED 14 and the ESD diode can be applied using known methods and can comprise known conductive materials, with a suitable material being, for example, gold (Au). It is understood that LED package 10 according to the disclosure herein can be provided without an ESD element/diode or with an ESD element/diode that is external to LED package 10.

As described above, in conventional packages, heat typically does not spread efficiently into the submount, particularly those made of materials such as ceramic. In some embodiments, when an LED is provided on an attach pad that extends generally only under the LED, heat does not spread through most of the submount, and is generally concentrated to the area just below the LED. This can cause overheating of the LED which can limit the operating power level for the LED package.

Thermal resistance, however, in package 10 is lower than in other, conventional packages. This lower thermal resistance can lead to lower operating temperatures for the LED by allowing quicker heat dissipation therefrom. Such lower thermal resistance can thus lead to greater lumen performance of the attached LED(s) and a greater lifetime for the LED(s). As above, for example, thermal resistance can be lower for package 10 with submount 12 comprising aluminum nitride (AlN) as compared to similarly sized chips with ceramic submounts. Package 10 can have a thermal resistance of approximately 3° C./Watt or less. In some embodiments, package 10 can have a thermal resistance of approximately 2.5° C./Watt or less. Pads 20, 22, 24 can provide extending thermally conductive paths to laterally conduct heat away from LED 14 such that it can spread to other areas of submount 12 beyond the areas just below LED 14 to further improve heat dissipation. Attach pad 20 can cover more of the surface of submount 12 than LED 14, with attach pad 20, for example, extending from the edges of LED 14 toward the edges of submount 12. As in the embodiment shown, attach pad 20 can be generally circular and can extend radially from LED 14 toward the edges of submount 12. A portion of attach pad 20 can intersect with first and second contact pads 22, 24, with gap 26 separating part of attach pad 20 adjacent to second contact pad 24. It is understood that attach pad 20 can be many other shapes and in some embodiments, for example, it can extend to the edge of submount 12.

Contact pads 22, 24 can also cover the surface of submount 12 extending out from vias 34. For example, contact pads 22, 24 can cover the area between vias 34 and the edges of the submount 12. By extending pads 20, 22 and 24 in this manner, the heat spreading from LED 14 can be improved. Thermal dissipation of heat generated in LED 14 can thus be improved, which improves the operating life and allows for higher operating power for LED 14 and LED package 10. Pads 20, 22, and 24 can cover different percentages of top surface 16 of submount 12, with a typical coverage area being greater than 50%. In LED package 10, pads 20, 22 and 24 can, for example, cover approximately 70% of submount 12. In other embodiments, the coverage area can, for example, be greater than 75%.

As shown for example beginning with FIGS. 3 and 5, LED package 10 can further comprise a bottom thermally conductive element that can comprise thermal pad 40 on back surface 18 of submount 12 between first and second mounting pads 30, 32. Thermal pad 40 can be made of a heat conductive material and can be in at least partial vertical alignment with LED 14. In some embodiments, thermal pad 40 may not be in electrical contact with the elements on top surface 16 of submount 12 or first and second mounting pads 30, 32 on back surface 18 of submount 12. Although heat from the LED can be laterally spread over top surface 16 of submount 12 by attach pad 20 and pads 22, 24, more heat can pass into submount 12 directly below and around LED 14 with such placement of thermal pad 40. Thus, thermal pad 40 can assist with this dissipation by allowing this heat to spread into thermal pad 40 where it can dissipate more readily. It is also noted that the heat can conduct from top surface 16 of submount 12, through vias 34, where the heat can spread into first and second mounting pads 30, 32 where it can also dissipate. For package 10 used in surface mounting, the thickness of thermal pad 40 and first and second pads 30, 32 as seen in FIGS. 3 and 5 can be approximately the same such that all three make contact to a lateral surface such as a PCB. Thermal pad 40 can be attached to a larger heat sink if desired.

Thermal pad 40 can comprise a metal that may or may not be electrically conductive. In one aspect, thermal pad 40 can be electrically attached to at least one of first contact pad 22 or second contact pad 24. In another aspect, thermal pad 40 can be electrically neutral allowing one or more LEDs to be configured in an array using a common metal substrate without risk of electrical shorting, thus simplifying thermal design.

Solder dams 28 (shown in dotted lines) can be included around the area of attach pad 20 for mounting of LED 14. Solder dams 28 can help center LED 14 to reduce movement of LED 14 from the mounting area while the mounting solder is in liquid form. When the liquid solder encounters any one of dams 28, movement can be slowed or stopped. Thereby, the movement of LED 14 on attach pad 20 can be reduced until the solder hardens.

An optical element or lens 50 can be formed on top surface 16 of submount 12, over LED 14. Lens 50 can provide both environmental and/or mechanical protection. Lens 50 can be in different locations on the top surface 16. As shown, lens 50 can be located with LED 14 placed at approximately a center of a base of lens 50. In some embodiments, lens 50 can be formed in direct contact with the LED and top surface 16 on submount 12. In other embodiments, there may be an intervening material or layer between LED 14 and top surface 16. Direct contact to LED 14 can provide certain advantages such as improved light extraction and ease of fabricating. In particular, lens 50 can be molded onto submount 12.

Lens 50 can be molded using different molding techniques. Lens 50 can be many different shapes depending on the desired shape of the light output. One suitable shape as shown is hemispheric, with some examples of alternative shapes being ellipsoid bullet, flat, hex-shaped and square. Many different materials can be used for lens 50 such as silicones, plastics, epoxies or glass, with a suitable material being compatible with molding processes. Silicone is suitable for molding and provides suitable optical transmission properties. For example, a silicone can be selected that has a high refractive Index and high transparency. It can also withstand subsequent reflow processes and does not significantly degrade over time. It is understood that lens 50 can also be textured to improve light extraction or can contain materials such as phosphors or scattering particles. Lens 50 can vary in size. The size of the lens can vary based on the size of package 10, in particular, submount 12. For example, an approximately 3.5 mm by approximately 3.5 mm submount 12 can have a lens 50 can have a radius size of approximately 1.275 mm or greater. In some embodiments, an approximately 3.5 mm by approximately 3.5 mm submount 12 can have a lens 50 can have a radius size of approximately 1.275 mm. Lens 50 can for example have a radius size of between approximately 1.275 mm to approximately 1.53 mm. Package 10 can also comprise a protective layer 52 covering top surface 16 of submount 12 between lens 50 and edge of submount 12. Layer 52 can provide additional protection to the elements on top surface 16 to reduce damage and contamination during subsequent processing steps and use. Protective layer 52 can be formed during formation of lens 50 and can comprise the same material as lens 50. It is understood, however, that package 10 can also be provided without protective layer 52. For example, a technique for molding lens 50 and/or protective layer 52 can include those described in U.S. patent application Ser. No. 11/982,275 entitled "Light Emitting Diode Package and Method of Fabricating Same", which, as stated above, is also incorporated herein by reference.

Lens 50 can also be able to withstand certain sheer forces before being displaced from submount 12. In one embodiment, the lens can withstand approximately a 1 kilogram (kg) or more sheer force. Embodiments of package 10 using silicones that are harder after curing and have a higher durometer reading, such as Shore A 70 or higher, in molding lens 50 may tend to better withstand sheer forces. Properties such as high adhesion and high tensile strength can also contribute to the ability of lens 50 to withstand sheer forces. The lens arrangement of LED package 10 can easily be adapted for use with secondary lens or optics that can be included over lens 50 by the end user to facilitate beam shaping. These secondary lenses are generally known in the art, with many of them being commercially available.

Thus, LED packages 10 as described above can be used with at least one LED 14 that can emit a dominant wavelength generally between approximately 600 nm and approximately 650 nm, and more particularly between approximately 610 nm and approximately 630 nm, when an electrical signal is applied to package 10, thereby emitting a red or red-orange light. When a current of approximately 350 mA is applied to package 10, package 10 can be configured to have a lumen performance of a minimum luminous flux of approximately 90 lm or greater. In some embodiments, package 10 can be configured to have a lumen performance of a minimum luminous flux of approximately 100 lm or greater. For example, a package 10 in which LED 14 generates a dominant wavelength between approximately 610 nm and approximately 630 nm when an electrical signal can be applied to top electrically conductive elements such as contact pads 22, 24 can be configured to have a minimum luminous flux that can be approximately 90 lm or greater. Such an LED package 10 can have, for example, a luminance performance with a minimum luminous flux of approximately 95 lm or greater even in package 10. Wavelength shift can be approximately 0.5 nanometers for a current of approximately 1,000 milliamps.

The size of submount 12 and package 10 can vary depending on different factors, such as, for example, the size of LED(s) 14. Package 10 can have a height H. For example, height H of package 10 can be approximately 2.0 mm as measured between a top of lens 50 and bottom surface 18 of submount 12 as shown in FIG. 2. Package 10 can, as shown in FIG. 1 for example, have a width W and length L that can be generally the same as the length and width of submount 12. For example, package 10 can have a width W of between approximately 3.2 mm and approximately 3.6 mm. Package 10 can have a length L of approximately 3.2 mm and approximately 3.6 mm. For example, package 10 can have a width W of approximately 3.45 mm and a length L of approximately 3.45 mm. When a 1 mm LED is used, package 10 can have a width W of approximately 3.5 mm and a length L of approximately 3.5 mm. When a 0.7 mm LED is used, package 10 can have a width W of approximately 3.2 mm and a length L of approximately 3.2 mm. It is further understood that submount 12 and outer perimeter of package 10 can have other shapes, as viewed from above, including circular, rectangular or other multiple sided shapes.

Since package 10 can be relatively small, but still emit a large amount of light, package 10 can have a large luminous flux to footprint ratio. As an example, an LED package that comprises an LED that generates a dominant wavelength of between approximately 610 nm and approximately 630 nm that can have a luminous flux of 90 lm or greater for a footprint area of approximately 12 mm$^2$ can have a luminous flux to foot print ratio of greater than approximately 7.5 lm/mm$^2$ for a red and/or red-orange light emitting LED. Thus, package 10 can produce a minimum luminous flux to footprint ratio of greater than approximately 7.5 lm/mm$^2$. In some embodiments, package 10 can produce a minimum luminous flux to footprint ratio of approximately 3.75 lm/mm$^2$ or greater. In some embodiments, package 10 can produce a minimum luminous flux to footprint ratio of approximately 8.3 lm/mm$^2$ or greater. For example, package 10 can produce a minimum luminous flux to footprint ratio of between approximately 3.75 lm/mm$^2$ and approximately 8.3 lm/mm$^2$ for a red and/or red-orange light emitting LED. For example, package 10 can produce a minimum luminous flux to footprint ratio of between approximately 5.9 lm/mm$^2$ and approximately 7.9 lm/mm$^2$ for a red and/or red-orange light emitting LED.

Similarly, LED packages 10 as described above used with at least one LED 14 that can emit a dominant wavelength between approximately 610 nm and approximately 630 nm can be efficient in its energy use by generating a high amount of lumens per unit of power used. For example, packages 10 can be configured to generate a light output having a high amount of lumens per watt (lm/W) for a red and/or red-orange light emitting LED such a wavelength range of between approximately 610 nm and approximately 630 nm, or between 610 nm and approximately 620 nm. In some embodiments, LED package 10 can be configured to generate a light output of approximately 120 lm/W or greater for a red and/or red-orange light emitting LED. In some embodiments, the lumens per watt generated by LED package 10 can be, approximately 130 or greater for a red and/or red-orange light emitting LED.

LED package 10 as described above used with at least one LED 14 that can emit a dominant wavelength between approximately 610 nm and approximately 630 nm such package 10 can also have a reduced thermal resistance as compared to conventional LED packages. For example, package 10 can be configured to have a thermal resistance of approximately 3° C./Watt or less. In some embodiments, the thermal resistance for LED package 10 can be approximately 2.5° C./Watt or less. LED package 10 as described above used with at least one LED 14 that can emit a dominant wavelength between approximately 610 nm and approximately 630 nm such package 10 can thus also have a greater operational lifetime as compared to conventional LED packages. For example and based upon operating conditions, LED package 10 can have a predicted L70 lifetime based upon standard modeling practices for lighting of at least 50,000 hours or greater at 350 milliamps and 85° C. In a further aspect, LED package 10 can be configured to have an operational lifetime of at least 35,000 hours or greater at 350 milliamps and 85° C.

Figure 7:
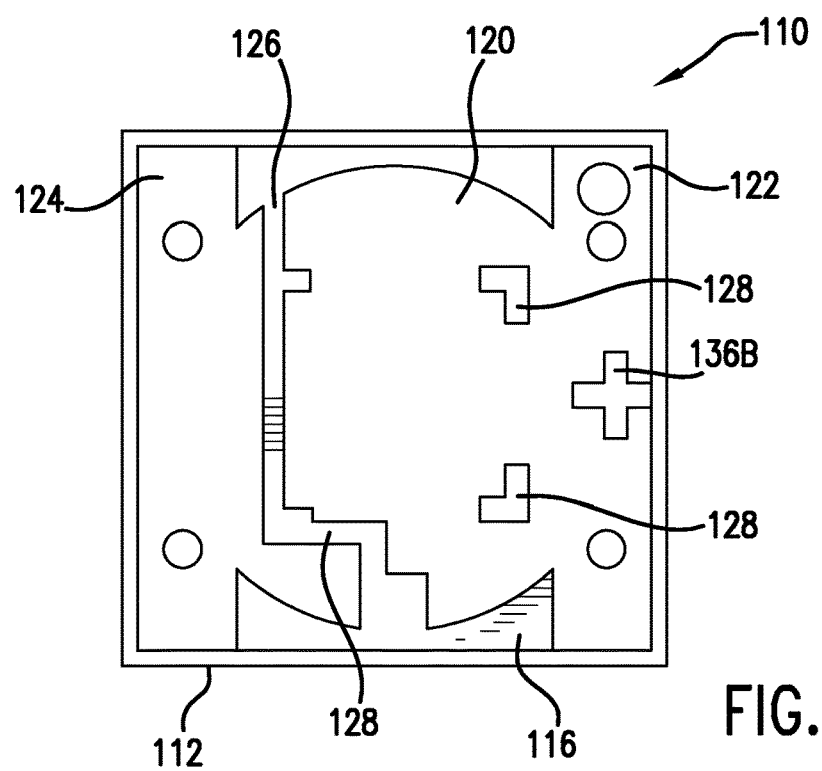
FIG. 7 is a top plan view illustrating a portion of an embodiment of a package for an LED according to the subject matter disclosed herein.
Figure 8:
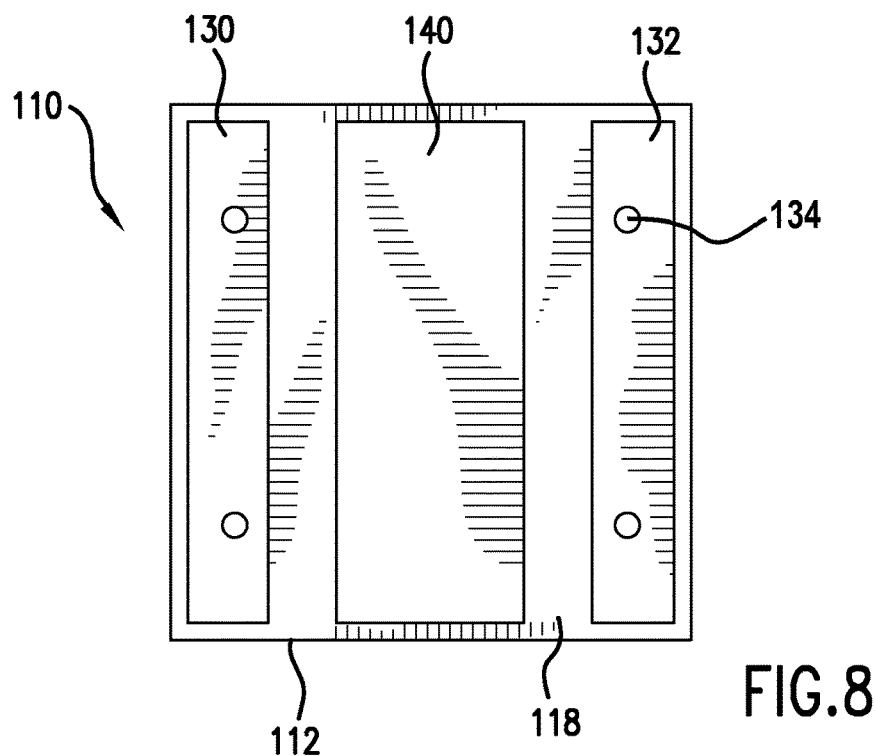
FIG. 8 is a bottom plan view illustrating the embodiment of the package for an LED according to FIG. 7.
Figure 9:
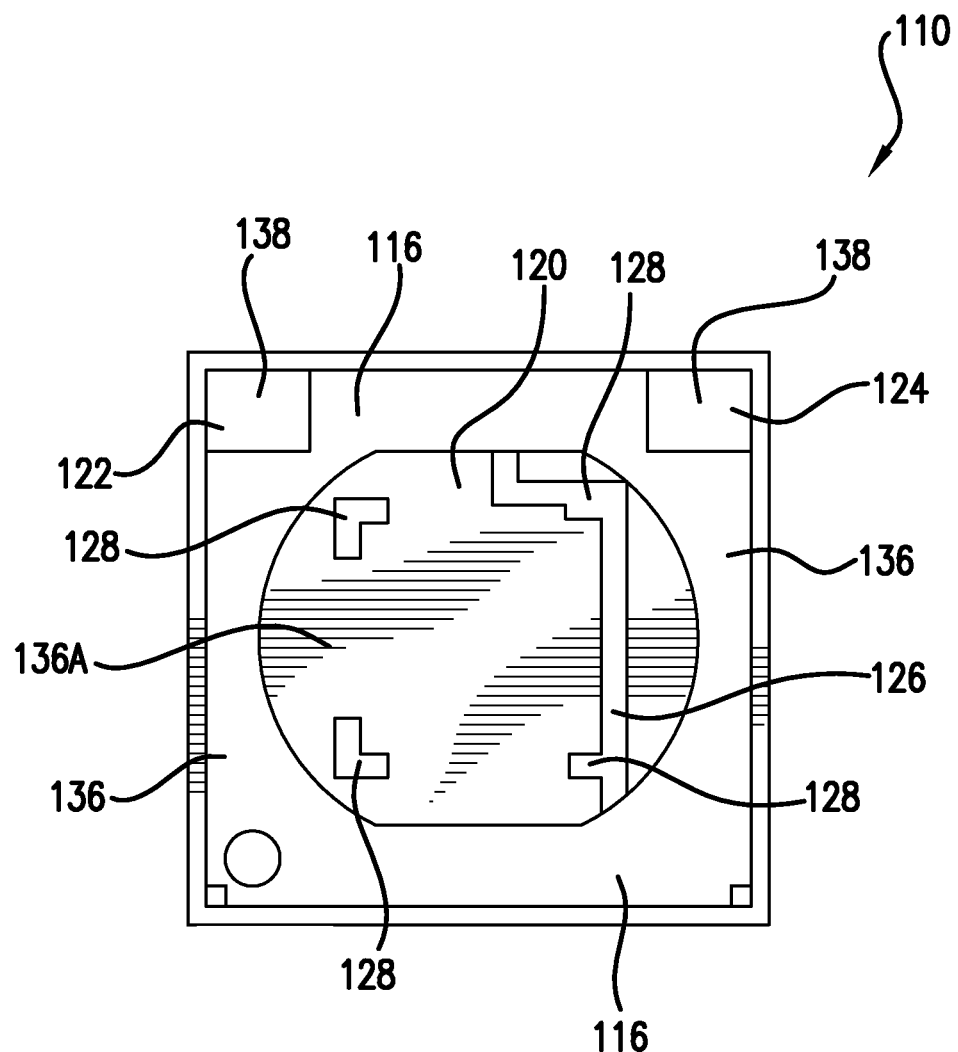
FIG. 9 is a top plan view illustrating the embodiment of the package for an LED according to FIG. 7 with an embodiment of a solder mask disposed thereon according to the subject matter disclosed herein.

FIGS. 7-9 show another embodiment of a package generally designated 110 for one or more LEDs. As above, package 110 can comprise a submount 112 that can have a top surface 116 and a bottom surface 118. Patterned conductive features such as top electrically conductive elements can reside on top surface 116 of submount 112. Top electrically conductive elements can comprise a die attach pad 120 with an integral first contact pad 122 and second contact pad 124. One or more LEDs (not shown) can be mounted approximately at the center of attach pad 120. The one or more LEDs can comprise at least one LED that can emit a dominant wavelength generally between approximately 600 nm and approximately 650 nm, and more particularly between approximately 610 nm and approximately 630 nm, to emit a red and/or red-orange light.

These patterned electrically conductive elements can provide conductive paths for electrical connection to the LED using known contacting methods. The LED can be mounted to attach pad 120 using known methods and material for mounting such as using conventional solder materials that may or may not contain a flux material or dispensed polymeric materials that may be thermally and electrically conductive. Attach pad 120 and first and second contact pads 122, 124 can comprise materials such as metals or other conductive materials as outlined above. As noted above, the LED can be attached to attach pad 120 with the polarity of the LED reversed such that the N-cladding of the LED is below the multi-quantum well and the P-cladding of the LED is above the multi-quantum well.

As above, a gap 126 seen in FIGS. 7 and 9 can be included between second pad 124 and attach pad 120 down to the surface of submount 112. Gap 126 can be in different shapes and widths. For example, as in the embodiment shown, gap 126 can extend in a straight line and/or can have turns, such as angled turns therein. Such turns can be used as markers for placement of the one or more LEDs. Gap 126 can provide electrical isolation between attach pad 120 and second pad 124, which can be used to prevent shorting of the signal applied to the LED. An electrical signal can be applied to the LED through second pad 124 and first pad 122 with the electrical signal on first pad 122 passing to the LED through attach pad 120 and the signal from second pad 124 passing into the LED through wire bonds (not shown).

As above, in some embodiments an electrical signal can be applied to package 110 by providing external electrical contact to first and second bond pads 122, 124 such as by solder contacts or other conductive paths to a PCB. Package 110 can be arranged for mounting using surface mount technology and having internal conductive paths; such as first and second surface mount pads 130, 132 that can be formed on back surface 118 of submount 112 and vias 134 as shown in FIG. 8. As above, first and second surface mount pads 130, 132 can be at least partially aligned with first and second contact pads 122, 124, respectively. It is understood that mounting pads 130, 132 and vias 134 can be arranged in many different ways and can have many different shapes and sizes. It is also understood that instead of vias, one or more conductive traces can be provided on the surface of submount 112 between the mounting pads and contact pads, such as along a side surface of the submount. Package 110 can further comprise a bottom thermally conductive element that can comprise a thermal pad 140 as shown in FIG. 8 on back surface 118 of submount 112, between first and second mounting pads 130, 132. Thermal pad 140 can comprise a heat conductive material and can be in at least partial vertical alignment with the portion of attach pad 120 where the LED is to be attached for the reasons described above.

As shown in FIG. 9, a solder mask 136 made of conventional materials can be included on top surface 116 of submount 112, at least partially covering attach pad 120 and first and second contact pads 122, 124, and at least partially covering gap 126. As above, solder mask 136 can protect these features during subsequent processing steps and in particular mounting the LED (not shown) to attach pad 120 and wire bonding. Solder mask 136 can serve as an insulating and protective material that can reduce or prevent dangers associated with solder or other materials being deposited in undesired areas, which can result in damage to package 110 or result in electrical shorting. Solder mask 136 can comprise an opening 136A for mounting the LED to attach pad 120 and for attaching wire bonds (not shown) to second contact pad 124. Solder mask 136 can also comprise side openings 138 to allow convenient electrical access to first and second contact pads 122, 124, respectively, for testing package 110 during fabrication. Solder mask 136 can also have alignment holes that provide for alignment during fabrication of package 110 and also allow for alignment when mounted in place by an end user.

Additionally, as above, attach pad 120 can be provided with a symbol or indicator 136B to illustrate which side of LED package 110 should be coupled to a positive or negative aspect of the signal to be applied to package 110 as shown in FIG. 7. Symbol 136B can ensure accurate mounting of LED package 110 to a PCB or other fixture, whether by machine or hand. In the embodiment shown the symbol 136B comprises a plus (+) sign over first contact pad 122, indicating that the package 110 should be mounted with the positive of the signal coupled to the first surface mount pad 132. Thus, the negative of the signal would then be coupled to second mount pad 130 and second conductive pad 124. It is understood that many different symbol types can be used and that a symbol can also be included on or over second conductive pad 124.

Further, as shown in embodiments of FIGS. 7-9, cut-outs 128 can be included in attach pad 120 to aid in alignment of the LED. Cut-outs 128 can comprise many different shapes and sizes. In the embodiment shown, cut-outs 128 can provide generally a square outline. When mounting the LED chip to that attach pad 120, the corners of the LED chip can fit on the inside edge of cut-outs 128 for proper alignment. Additionally, cut-outs 128 can be formed by part of gap 126.

LED packaging configured as packages 10 and 110 can provide a greater minimum luminous flux than LED packages using conventional types of packaging. Thus, LED packages similar to LED packages 10 and 110 can be approximately 10% to approximately 25% brighter than conventional LED packages for LEDs that generate a dominant wavelength between, for example, approximately 610 and approximately 630 nm or between approximately 610 and approximately 620 nm. Packages 10, 110 can be configured to generate a light output of a large amount of lumens per watt. In some embodiments, LED packages 10, 110 can be configured to generate a light output of approximately 120 lm/W or greater. In some embodiments, the lumens per watt generated by LED packages 10, 110 can be approximately 130 lm/W or greater.

Further, such packages 10, 110 can be configured to have a lumen performance when a current of approximately 350 mA is applied to packages 10, 110 that can be a minimum luminous flux of approximately 90 lm or greater. For example, the LED(s) that can emit light having a dominant wavelength of approximately 610 to approximately 630 nm can have a luminance performance with the minimum luminous flux of approximately 95 lm or greater in packages 10, 110.

As stated above, LED packages 10, 110 as described above used with at least one LED 14 that can emit a dominant wavelength between approximately 610 nm and approximately 630 nm such packages 10, 110 can also have a reduced thermal resistance as compared to conventional LED packages. For example, packages 10, 110 can be configured to have a thermal resistance of approximately 3° C./Watt or less. In some embodiments, the thermal resistance for LED packages 10, 110 can be approximately 2.5° C./Watt or less. Thereby, due to the improve performance characteristics described above, LED packages 10, 110 that have at least one LED that can emit a dominant wavelength between approximately 600 nm and approximately 650 nm can thus also have greater operational lifetimes as compared to conventional LED packages. For example and based upon operating conditions, LED packages 10, 110 can have a predicted L70 lifetime based upon standard modeling practices for lighting of at least 50,000 hours or greater at 350 milliamps and 85° C. In a further aspect, they can have an operational lifetime of at least 35,000 hours or greater at 350 milliamps and 85° C.

Embodiments of the present disclosure shown in the drawings and described above are exemplary of numerous embodiments that can be made within the scope of the appended claims. It is contemplated that the configurations of LED packages and methods disclosed herein can comprise numerous configurations other than those specifically disclosed.

What is claimed is:

1. A light-emitting die (LED) package comprising:
a ceramic submount comprising a top surface, a bottom surface, and a plurality of side edges;
a bottom thermally conductive element disposed on the bottom surface of the submount for conducting heat from the submount;
an LED having a multi-quantum well and disposed on the submount, the LED operable for emitting a dominant wavelength between approximately 610 nm and approximately 630 nm, the LED having a luminous flux that is approximately 100 lm or greater, such that a minimum luminous flux to footprint ratio for the LED package is greater than approximately 5.8 lm/mm$^2$ of a footprint of the LED package when an electrical signal comprises a current of approximately 350 mA;
a flux eutectic LED die attachment attaching the LED to the submount;
a lens molded over the LED and the submount; and
a protective layer substantially disposed over the top surface of the ceramic submount between the ceramic submount and the lens;
wherein a polarity of the LED is such that an N-cladding of the LED is below the multi-quantum well and a P-cladding of the LED is above the multi-quantum well; and
wherein each of the plurality of side edges of the ceramic submount is substantially flush with a corresponding side edge of the protective layer,
wherein the LED package generates a light output of approximately 120 lumens/watt or greater.

2. The LED package of claim 1, wherein the submount comprises aluminum nitride.

3. The LED package of claim 1, wherein the LED package is configured to generate a light output of approximately 130 lumens/watt or greater.

4. The LED package of claim 1, wherein the LED package is configured to have a predicted L70 lifetime of at least 50,000 hours or greater at 350 milliamps and 85° C.

5. The LED package of claim 1, wherein the lens is of a radius size of approximately 1.275 mm or greater.

6. The LED package of claim 1 wherein the LED package comprises:
a plurality of top electrically conductive elements on the top surface of the submount; and
the LED disposed on at least one of the top electrically conductive elements.

7. The LED package of claim 6, wherein the submount comprises aluminum nitride.

8. The LED package of claim 1, wherein the protective layer is substantially disposed over an entirety of the top surface of the ceramic submount between the ceramic submount and the lens.

9. A light-emitting die (LED) package comprising:
a ceramic submount comprising a top surface, a bottom surface, and a plurality of side edges;
a bottom thermally conductive element disposed on the bottom surface of the submount for conducting heat from the submount;
an LED having a multi-quantum well and disposed on the submount, the LED operable for emitting a dominant wavelength between approximately 610 nm and approximately 630 nm, the LED having a luminous flux that is approximately 100 lm or greater, such that a minimum luminous flux to footprint ratio for the LED package is greater than approximately 5.8 lm/mm$^2$ of a footprint of the LED package when an electrical signal comprises a current of approximately 350 mA;
a flux eutectic LED die attachment attaching the LED to the submount;
a lens molded over the LED and the submount; and
a protective layer substantially disposed over the top surface of the ceramic submount between the ceramic submount and the lens;
wherein a polarity of the LED is such that an N-cladding of the LED is below the multi-quantum well and a P-cladding of the LED is above the multi-quantum well; and
wherein each of the plurality of side edges of the ceramic submount is substantially flush with a corresponding side edge of the protective layer,
wherein the LED package generates a light output of approximately 120 lumens/watt or greater.

10. The LED package of claim 9, wherein the submount comprises aluminum nitride.

11. The LED package of claim 9, wherein the LED package is configured to generate a light output of approximately 130 lumens per watt or greater.

12. The LED package of claim 9, wherein the LED package is configured to have a predicted L70 lifetime of at least 50,000 hours or greater at 350 milliamps and 85° C.

13. The LED package of claim 9, wherein the lens is of a radius size of approximately 1.275 mm or greater.

14. The LED package of claim 9 wherein the LED package comprises:
   a plurality of top electrically conductive elements on the top surface of the submount; and
   the LED disposed on one of the top electrically conductive elements.

15. The LED package of claim 14, wherein the submount comprises aluminum nitride.

16. A light-emitting die (LED) package comprising:
   a submount comprising aluminum nitride comprising a top surface, a bottom surface, and a plurality of side edges;
   a bottom thermally conductive element disposed on the bottom surface of the submount for conducting heat from the submount;
   an LED having a multi-quantum well and disposed on the submount, the LED operable for emitting a dominant wavelength between approximately 610 nm and approximately 630 nm, the LED having a luminous flux that is approximately 100 lm or greater, such that a minimum luminous flux to footprint ratio for the LED package is greater than approximately 5.8 lm/mm$^2$ of a footprint of the LED package when an electrical signal comprises a current of approximately 350 mA;
   a flux eutectic LED die attachment attaching the LED to the submount;
   a lens molded over the LED and the submount; and
   a protective layer substantially disposed over the top surface of the submount between the submount and the lens;
   wherein a polarity of the LED is such that an N-cladding of the LED is below the multi-quantum well and a P-cladding of the LED is above the multi-quantum well; and
   wherein each of the plurality of side edges of the ceramic submount is substantially flush with a corresponding side edge of the protective layer,
   wherein the LED package generates a light output of approximately 120 lumens/watt or greater.

17. A method of operating a light-emitting die (LED) package comprising:
   providing an LED package comprising:
      a ceramic submount comprising a top surface, a bottom surface, and a plurality of side edges;
      a bottom thermally conductive element disposed on the bottom surface of the submount for conducting heat from the submount;
      an LED disposed on the submount, the LED having a multi-quantum well with a polarity such that an N-cladding of the LED is below the multi-quantum well and a P-cladding of the LED is above the multi-quantum well, the LED operable for emitting a dominant wavelength between approximately 610 nm and approximately 630 nm, the LED having a luminous flux that is approximately 100 lm or greater, such that a minimum luminous flux to footprint ratio for the LED package is greater than approximately 5.8 lm/mm$^2$ of a footprint of the LED package when an electrical signal comprises a current of approximately 350 mA;
      a flux eutectic LED die attachment attaching the LED to the submount;
      a lens molded over the LED and the submount;
      wherein each of the plurality of side edges of the ceramic submount is substantially flush with a corresponding side edge of the protective layer;
   applying an electrical signal to the LED package; and
   generating a light output from the LED in the LED package that is approximately 120 lumens per watts or greater.

18. The method of claim 17, wherein the LED package is configured to have a predicted L70 lifetime of at least 50,000 hours or greater at 350 milliamps and 85° C.

19. A light-emitting die (LED) package comprising:
   a submount comprising a top surface, a bottom surface, and a plurality of side edges;
   a bottom thermally conductive element disposed on the bottom surface of the submount for conducting heat from the submount;
   an LED having a multi-quantum well and disposed on the submount, the LED operable for emitting a dominant wavelength between approximately 610 nm and approximately 630 nm, the LED having a luminous flux that is approximately 100 lm or greater, such that a minimum luminous flux to footprint ratio for the LED package is greater than approximately 5.8 lm/mm$^2$ of a footprint of the LED package when an electrical signal comprises a current of approximately 350 mA;
   a flux eutectic LED die attachment attaching the LED to the submount;
   a lens molded over the LED and the submount; and
   a protective layer substantially disposed over the top surface of the submount between the submount and the lens;
   wherein a polarity of the LED is such that an N-cladding of the LED is below the multi-quantum well and a P-cladding of the LED is above the multi-quantum well; and
   wherein each of the plurality of side edges of the ceramic submount is substantially flush with at least one corresponding side edge of the protective layer,
   wherein the LED package generates a light output of approximately 120 lumens/watt or greater.

* * * * *